United States Patent [19]

Harris

[11] Patent Number: 5,339,362

[45] Date of Patent: Aug. 16, 1994

[54] AUTOMOTIVE AUDIO SYSTEM

[75] Inventor: Wayne Harris, Higley, Ariz.

[73] Assignee: Rockford Corporation, Tempe, Ariz.

[21] Appl. No.: 819,365

[22] Filed: Jan. 7, 1992

[51] Int. Cl.⁵ .............................................. H04B 1/00
[52] U.S. Cl. ...................................... 381/86; 381/120; 455/6.3; 455/345
[58] Field of Search ..................... 381/120, 28, 86, 77; 455/345, 346, 347, 348, 349, 6.3; 340/310 CP; 330/2

[56] References Cited

U.S. PATENT DOCUMENTS

| | | |
|---|---|---|
| Re. 25,317 | 1/1963 | McCoy . |
| 2,452,384 | 10/1948 | McDonald, Jr. . |
| 2,876,345 | 3/1959 | Hartfield . |
| 2,926,240 | 2/1960 | Gollub . |
| 2,941,173 | 6/1960 | Gollub . |
| 2,973,431 | 2/1961 | Sontheimer . |
| 2,995,686 | 8/1961 | Selvin . |
| 3,036,222 | 5/1962 | Witt . |
| 3,054,024 | 9/1962 | Van Dillen et al. . |
| 3,091,736 | 5/1963 | Germain . |
| 3,531,723 | 9/1970 | Watanabe et al. . |
| 3,601,661 | 8/1971 | Kleinhample, Jr. . |
| 3,770,889 | 11/1973 | Gutschick et al. . |
| 4,124,815 | 11/1978 | Stoschek . |
| 4,131,851 | 12/1978 | Martiny et al. . |
| 4,135,158 | 1/1979 | Parmet . |
| 4,177,426 | 12/1979 | Gaishin et al. . |
| 4,276,654 | 6/1981 | Nations et al. . |
| 4,343,042 | 8/1982 | Schrock et al. . |
| 4,495,652 | 1/1985 | Leslie . |
| 4,503,513 | 3/1985 | Pogue, Jr. . |
| 4,509,190 | 4/1985 | Spector ................... 381/61 |
| 4,631,232 | 7/1985 | Sakurai . |
| 4,680,787 | 7/1987 | Marry . |
| 4,777,657 | 10/1988 | Gillaspie . |
| 4,797,949 | 1/1989 | Stites, III . |
| 4,824,106 | 4/1989 | Ueda et al. . |
| 4,855,896 | 8/1989 | Oho et al. . |
| 4,879,751 | 11/1989 | Franks et al. ............. 381/119 |
| 4,887,311 | 12/1989 | Garner et al. . |
| 4,905,304 | 2/1990 | Nakanishi et al. . |
| 4,964,076 | 10/1990 | Schurk . |
| 4,993,073 | 2/1991 | Sparkes .................... 381/119 |
| 5,010,444 | 4/1991 | Storrow et al. ............. 361/386 |

OTHER PUBLICATIONS

Richards et al, "An Experimental 'All-Digital' Studio Mixing Desk" JAES, vol. 30, No. 3, Mar. 1982, pp. 117-126.

Primary Examiner—Forester W. Isen
Attorney, Agent, or Firm—Warner, Norcross & Judd

[57] ABSTRACT

A modular automotive audio system includes a controller housing and an amplifier housing to be mounted within the vehicle trunk and a remote control for use within the passenger compartment. Modular signal processing components are received within the controller housing, and modular amplifier components are received within the amplifier housing. A controller module within the controller housing provides control for all signal processing components. The controller module polls all positions within the controller housing to determine which components are installed, and then the controller module configures itself via software to provide the control functions. Optionally, non-audio electronic components can also be received within the controller housing for common control by the system.

10 Claims, 33 Drawing Sheets

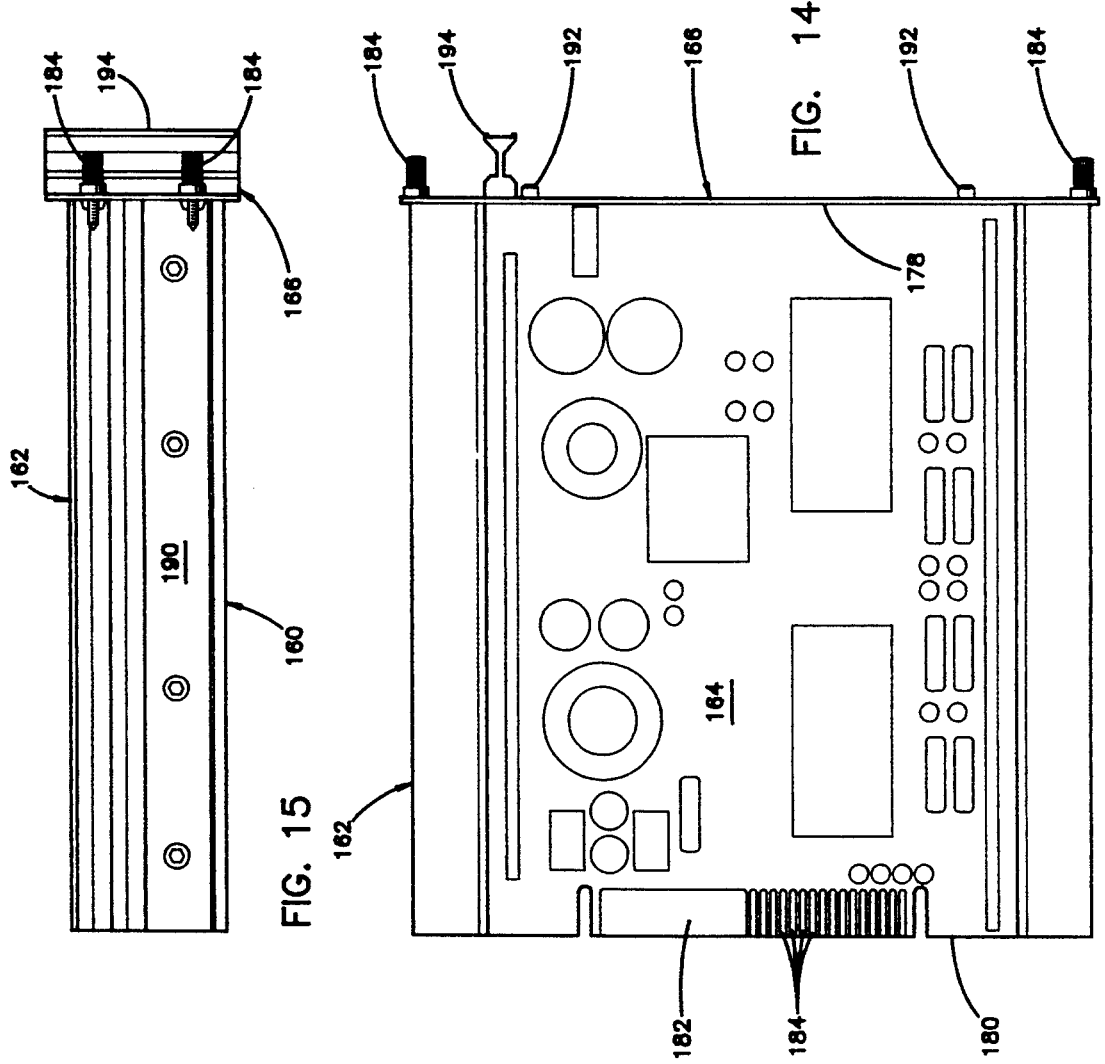
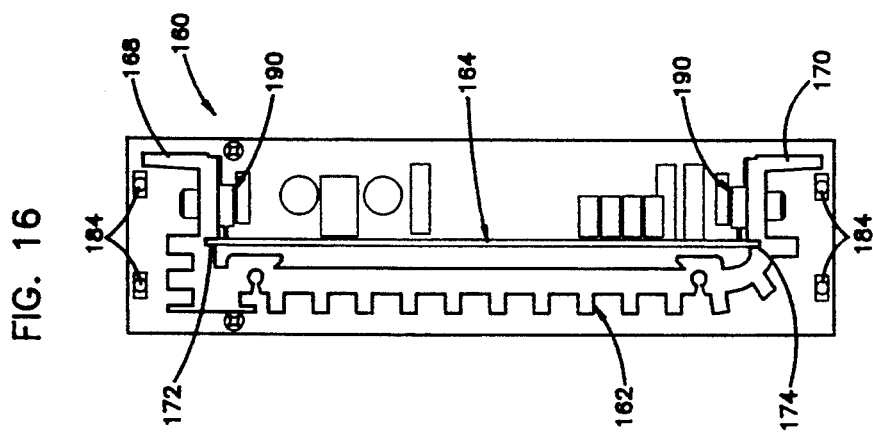

AUTOMOTIVE AUDIO SYSTEM

BACKGROUND OF THE INVENTION

The present invention relates to automotive audio systems and more particularly to such systems wherein a control unit is located in the passenger compartment and the signal processing and amplification equipment is located in the vehicle trunk. However, it is anticipated that the audio system will have applications beyond the automotive field.

Better and better audio systems have developed as both OEM (original equipment manufacturer) and after-market equipment for automobiles. As automotive engineering developments reduce sound levels (for example due to road and engine noise) within passenger compartments, more and more consumers are paying increased attention to the quality of their automotive audio systems.

In particular, audiophiles have demanded equipment far surpassing in quality that available from any OEM manufacturer. Such equipment can be voluminous and is often mounted within the vehicle trunk or other area remote from the passenger compartment. Exemplary components include amplifiers, woofers, and compact disc (CD) changers.

Arrangements for mounting the signal-processing portion of the audio system within the vehicle trunk are illustrated in U.S. Pat. No. 2,973,431 issued Feb. 28, 1961 to Sontheimer; U.S. Pat. No. 2,941,173 issued Jun. 14, 1960 to Gollub; U.S. Pat. No. 2,926,240 issued Feb. 23, 1960 to Gollub; and U.S. Pat. No. 2,876,345 issued Mar. 3, 1959 to Hartfield; and U.S. Pat. No. 4,503,513 issued Mar. 5, 1985 to Pogue. All of these systems include audio equipment within the trunk and a control unit within the passenger compartment for controlling the remote audio equipment.

Other radio frequency (rf) equipment has been mounted in the vehicle trunk. For example, a radio/telephone system is illustrated in U.S. Pat. No. 4,124,815 issued Nov. 7, 1978 to Stoschek. The Stoschek system includes a radio set removably mounted on a support within the vehicle trunk to provide interchangeability of communication equipment between fleet vehicles.

Whether mounted within the passenger compartment or within the trunk, the prior art systems all require the purchase and semi-permanent installation of individual discrete audio components, which preferably are selected, coordinated, and installed together. Such an arrangement unnecessarily increases the cost of the system due to the fact that each piece must function as a stand-alone unit. Compatibility is a significant concern with special care taken to match the various audio components.

SUMMARY OF THE INVENTION

The aforementioned problems are overcome in the present invention wherein modular audio components are supported within one or more racks mounted within the vehicle trunk. The system includes a controller housing, an amplifier housing, and a remote control. The two racks are mounted within the vehicle trunk, while the remote control is operated by the vehicle occupants to control the audio system. Modular audio components each comprising a circuit board are plugged into modular slots within the controller housing. Similarly, modular amplifier components are plugged into modular slots within the amplifier housing.

The required audio components within the controller housing include a power supply module, a controller module, a preamplifier module, and a loop through (output) module. The other modules are optional and include on-board controllers. A digital databus interconnects all of the card slots. The controller module polls the component slots upon system start up to detect both the presence and types of cards installed within the controller housing. Based upon this polling information, the controller module configures the system. During operation of the system, the user can control any of the functions provided by the audio components using the remote control which communicates with the controller module.

Each of the amplifier modules includes a heat sink and a circuit board that together slide into the housing.

The system of the present invention provides a modular and highly adaptable audio system. Components are easily changed, for example during upgrades, by removing one module and installing a substitute. Further, systems can be enhanced by purchasing additional component cards and inserting them in previously unoccupied slots. No significant hardware or software changes need be made when cards are installed and removed because the controller module polls the system and properly configures the system during each power initialization.

These and other objects, advantages, and features of the invention will be more readily understood and appreciated by reference to the detailed description of the preferred embodiment and the drawings.

BRIEF DESCRIPTION OF THE DRAWINGS

FIG. 14 is a side elevational view of an amplifier component;

FIG. 15 is a top plan view of an amplifier component;

FIG. 16 is a rear end elevational view Of the amplifier component;

DETAILED DESCRIPTION OF THE PREFERRED EMBODIMENT

Figure 1:
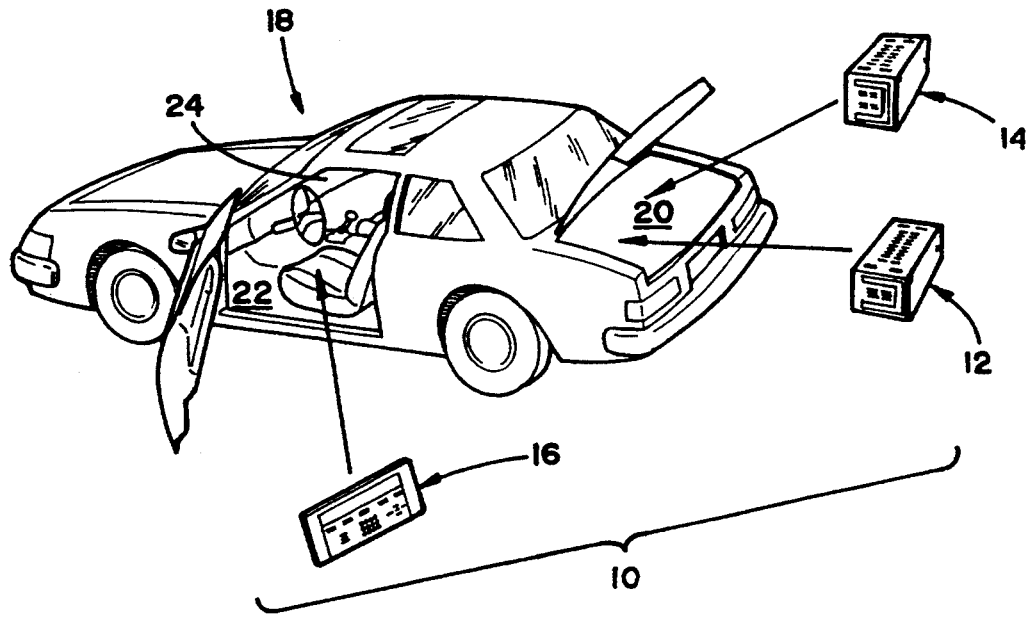
FIG. 1 is a perspective exploded view of an automobile and the components of the present invention.
Figure 17:
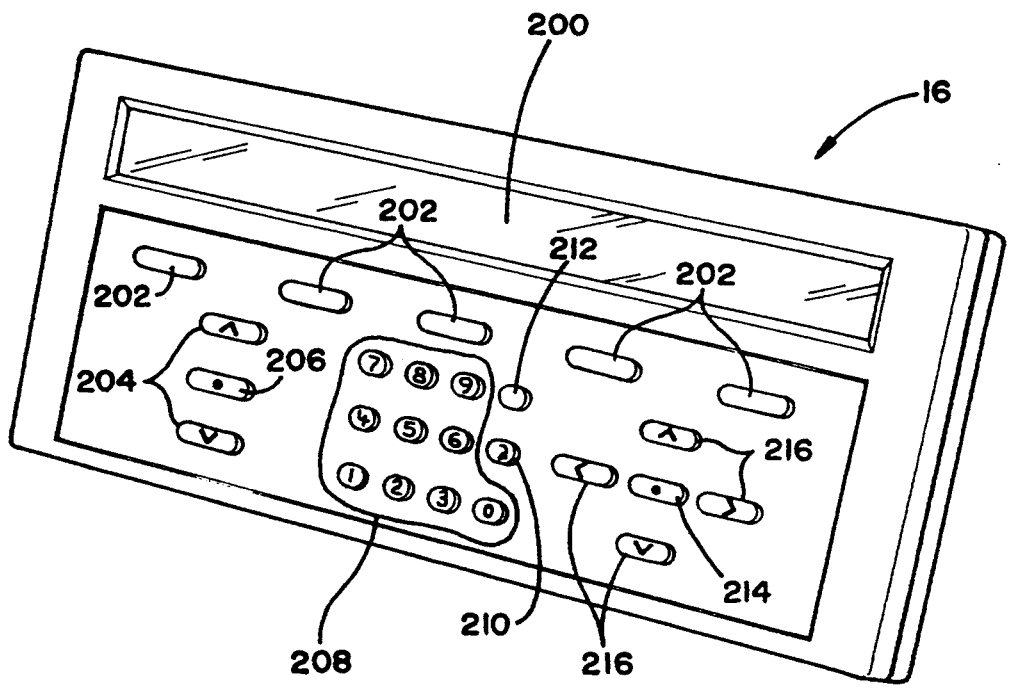
FIG. 17 is a perspective view of the remote data access terminal.

An automotive audio system constructed in accordance with a preferred aspect of the invention is illustrated in the drawings and generally designated 10. The system includes a controller housing 12 and supported components, an amplifier housing 14 and supported components, and a remote data access terminal (RDAT) 16. FIG. 1 illustrates the location of the components within an automotive vehicle 18. The controller housing 12 and the amplifier housing 14 are both mounted within the trunk 20; while the RDAT is located within the passenger compartment 22. The housings 12 and 4 are mounted in conventional fashion relating to high-end stereo components. The RDAT may be mounted in one of two methods. First, it may be mounted in the conventional radio location within the dashboard. Second, it may simply be loose within the compartment for handling and access by any occupant of the vehicle.

The controller housing 12 contains, interconnects, and controls all signal processing components (discussed below) within the system 10. The RDAT 16 communicates with the controller housing 12 either via a hardwire format or via a radio frequency (rf) link. In either event, information inputted into the RDAT 16 is communicated to the controller housing 12; and information generated by the controller housing 12 is communicated back to the RDAT 16 for display.

The amplifier housing 14 contains and interconnects the amplifier components (discussed below) to receive the audio signals from the controller housing 12 for amplification. Conventional speakers (not shown) are included throughout the vehicle compartment as desired in conventional fashion. The speakers are connected to the amplifier components within the amplifier housing in conventional fashion.

I. CONTROLLER

A. Controller Housing

Figure 2:
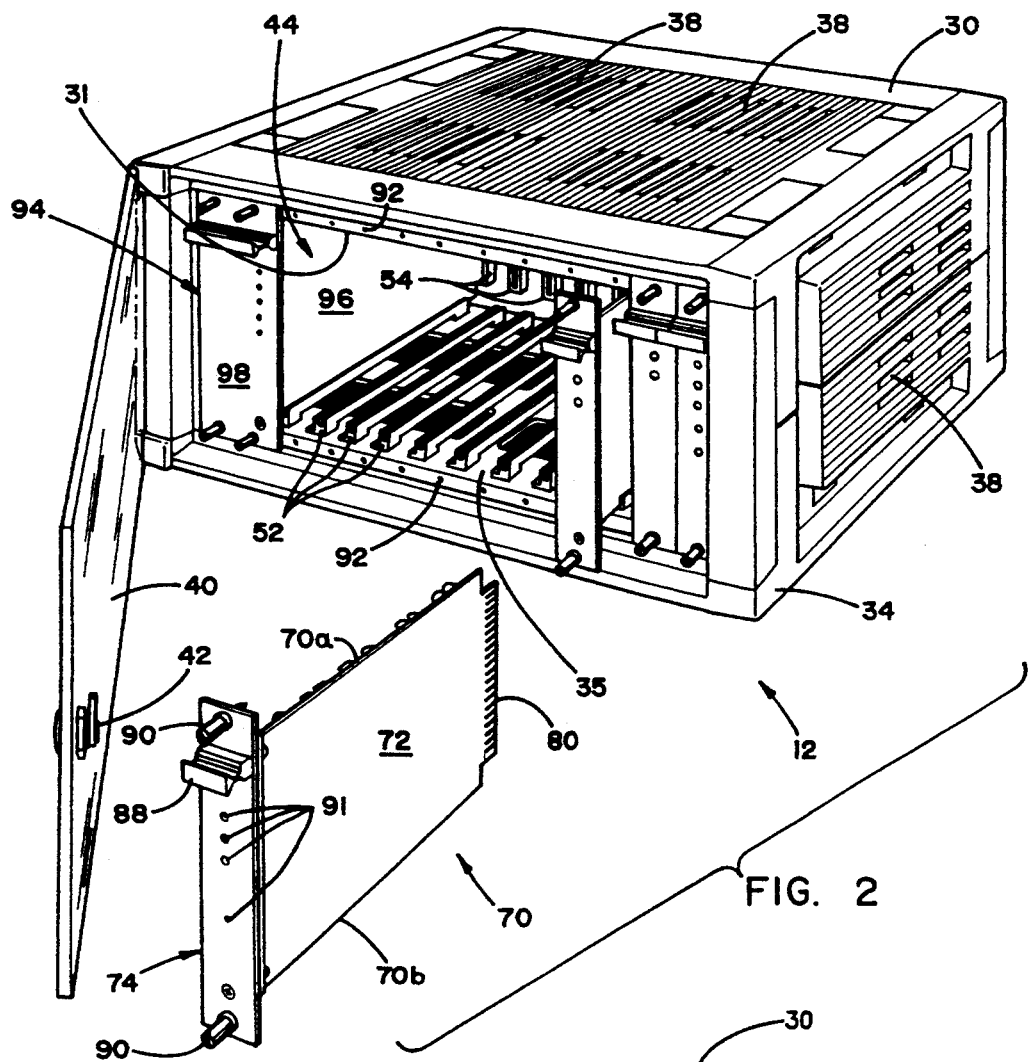
FIG. 2 is a perspective view of the controller housing with one card withdrawn.
Figure 3:
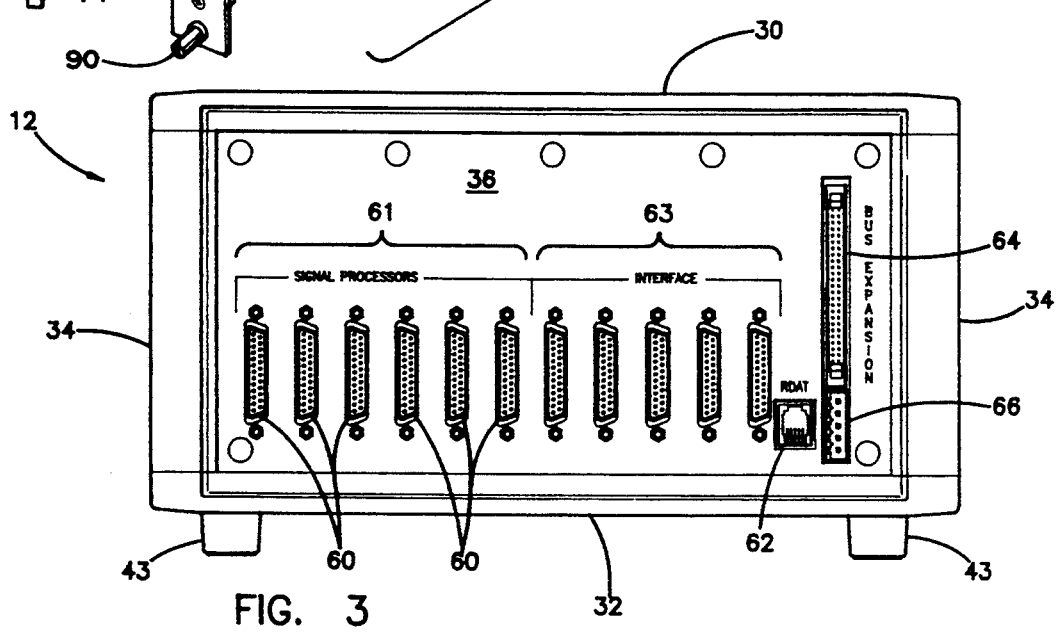
FIG. 3 is a rear elevational view of the controller housing.

The controller housing 12 is illustrated in FIGS. 2 and 3. The controller housing includes a top wall 30, a bottom wall 32, a pair of opposite side walls 34, and a rear wall 36. Vents 38 are provided in the top 30, bottom 32, and side walls 34 to permit air flow and therefore cooling of components within the housing 12. A hinged plexiglass door 40 is mounted on the front of the housing 12 to limit access to components mounted within the housing. The door 40 includes a lock 42 operated by a key (not shown). Feet 43 are provided on the bottom wall 32 to support the housing 12.

The walls 30, 32, and 34 and the door 40 together define a chamber 44 within the housing 12. Upper and lower chassis 31 and 35 are mounted within the chamber 44 and secured to upper and lower walls 30 and 32, respectively. These chassis are also vented to permit air flow. A plurality of slots or component locations 50 are located within the chamber and are each defined by a pair of vertically aligned tracks 52 mounted on the upper and lower chassis 31 and 35.

Each of the tracks 52 is injection molded of plastic and includes an integral barb (not visible) at each end snap-fitted into the respective chassis. The upper tracks (not visible) are identical to the lower tracks. Pairs of upper and lower tracks 52 are vertically aligned so that an audio component (to be described) fitted therein is retained in a vertical orientation. A conventional 62-pin edge-card type socket 54 is aligned with each pair of upper and lower tracks 52 so that a component ( to be described) fitted into the tracks will seat within one of the sockets 54 when fully inserted in the housing 12.

The exterior surface of the rear wall 36 of the controller housing 12 is illustrated in FIG. 3. The rear wall supports a plurality of DB25 connectors 60 each of which is electrically connected to a corresponding socket 54 (see FIG. 2) on the interior of the rear wall 36. The six connectors 60 and associated interior slots on the left side (when viewed from the rear) of the rear wall 36 are designated "signal processors" while the other five connectors 60 and associated slots are designated "interface" 63. The twelfth socket within the housing 12 is not ported through the back wall 36, but is reserved for the power supply module (to be described). The rear wall 36 also supports an RDAT jack 62 which is a conventional RJ-11 type jack. When the RDAT 16 is hardwired to the controller housing 12, a cable extends from the RDAT to the jack 62. When the RDAT is RF-linked to the controller housing, an RF transceiver (not shown) is connected to the jack 62.

Figure 5:
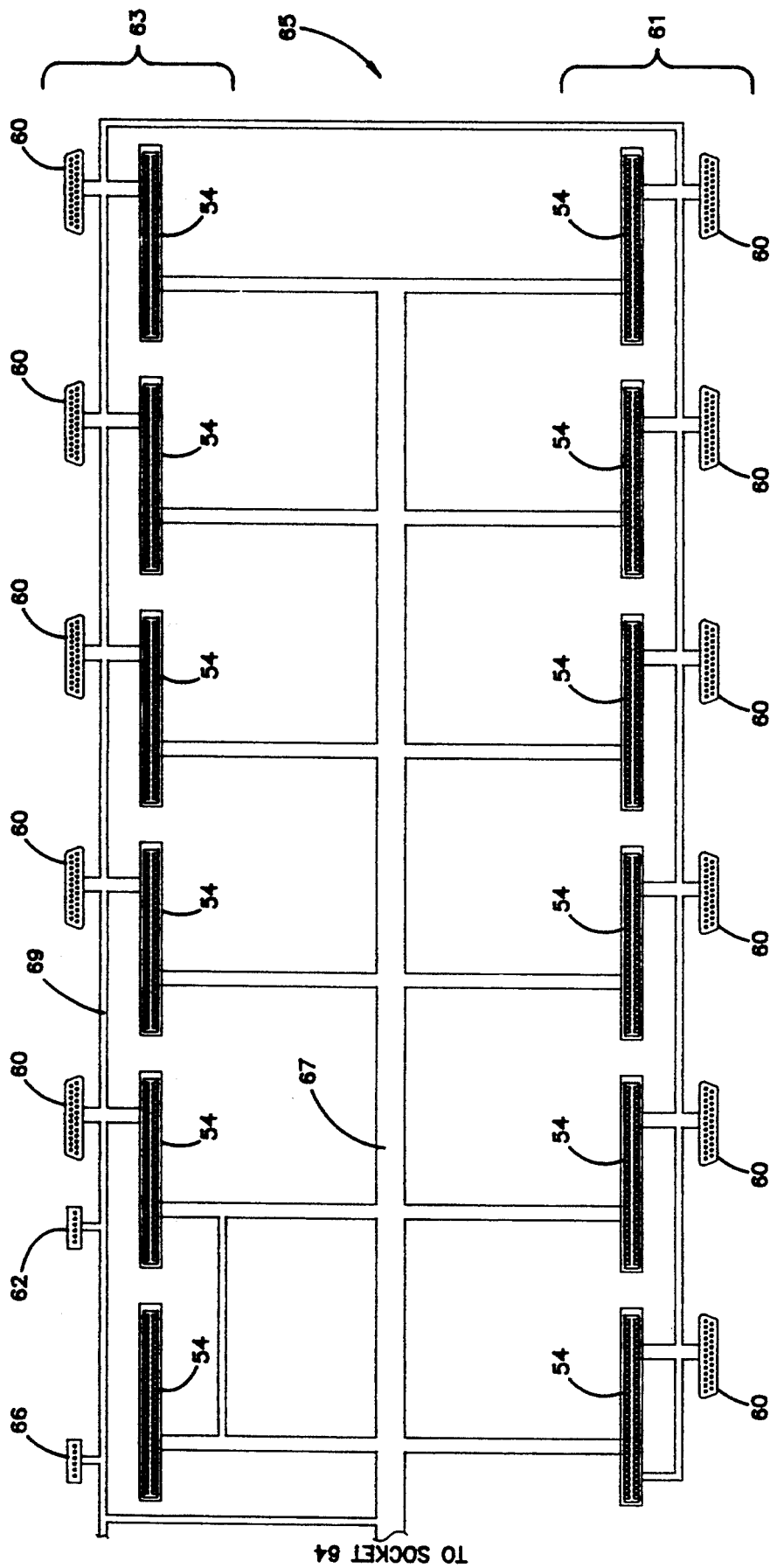
FIG. 5 is a schematic diagram of the controller housing mother board.
Figure 8:
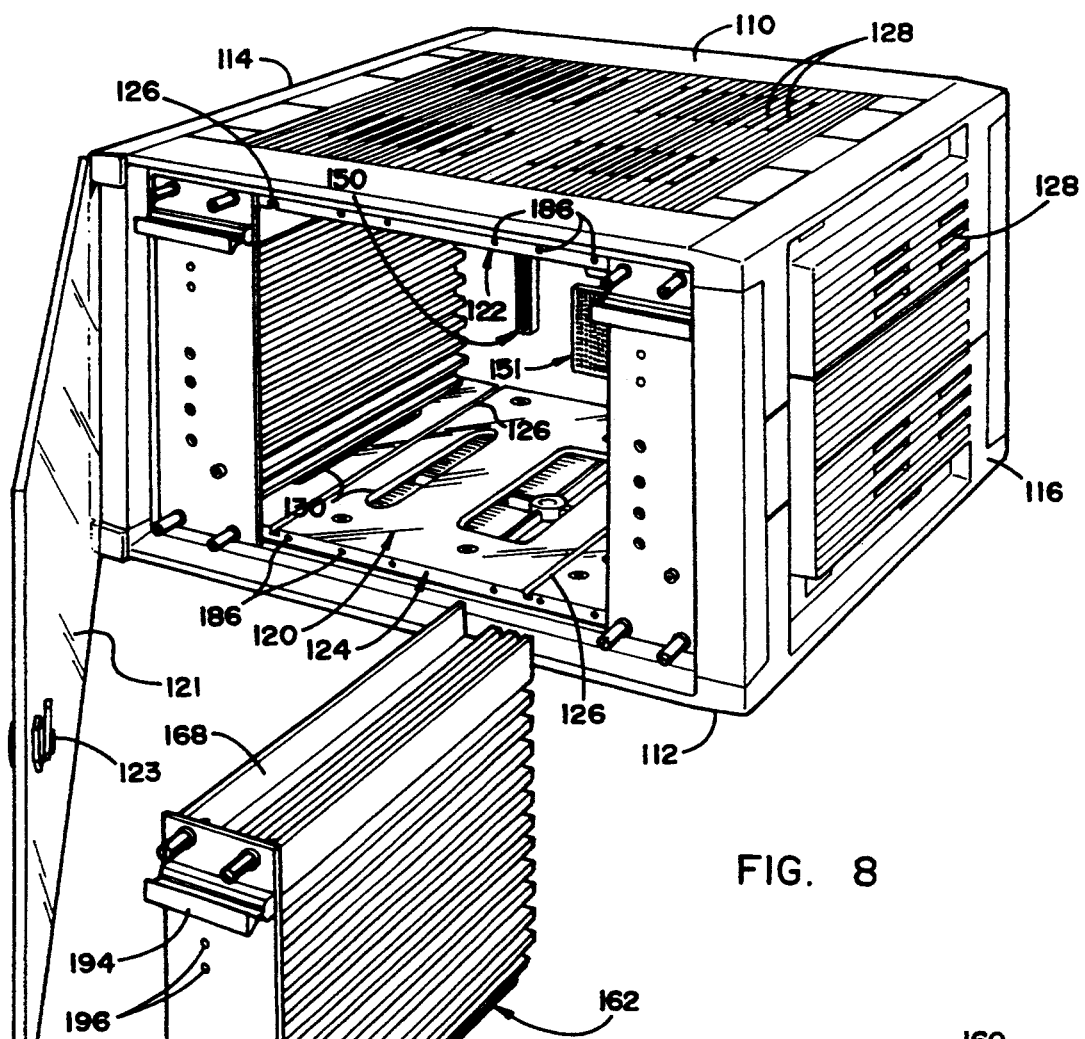
FIG. 8 is a perspective view of the amplifier housing with one amplifier card withdrawn.
Figure 9:
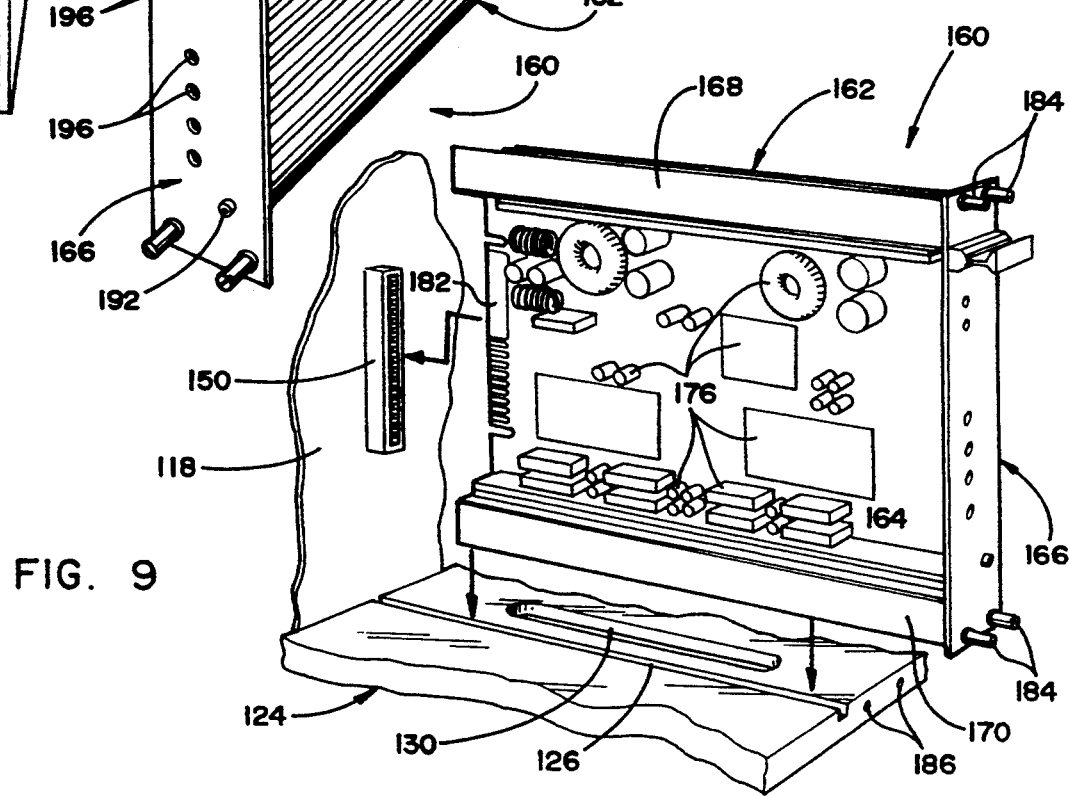
FIG. 9 is a fragmentary perspective view of an amplifier component partially installed within the amplifier housing.

The controller housing mother board 65 (FIG. 5) is passive and accepts up to twelve modules. For future expansion, the unit provides a 50-pin bus expansion port 64 (see FIG. 3 also) which allows multiple controller housings 12 to be daisy-chained together. Present total system capacity is 256 modules comprised of 64 unique module types with up to four each of any unique module. Larger capacity would be possible with minor software changes.

As mentioned above, six of the mother board's slots are dedicated for control and interface applications 63 while the other six slots are reserved for audio signal processor modules 61. Modules are not slot dependent and may be plugged into any slot within the appropriate six slot boundary. Signal processor modules may be digital, analog, or both. A signal processor is added by simply inserting the module into the housing. No wiring is required.

The controller housing 12 defines 12 slots and 12 sockets to receive cards. Therefore, up to 12 cards may be mounted within the controller housing 12 at any time. The first slot on the left of the controller housing (as viewed from the front) contains the power supply module (PSM) card 94. The PSM includes a single card 96 and a double-wide face plate 98 to accommodate the required width due to the components (not visible) mounted on the card 96.

The mother board bus includes a digital bus portion 67 and an analog bus portion 69. The digital bus 67 enables the controller module (a) to communicate with all modules in the controller housing and (b) to perform digital input/output with modules plugged into the interface slots 63. The audio bus 69 provides sequential routing of the audio signals through the installed modules in the signal processor slots 61. The pin-out definitions for the controller mother board 65 are as follows:

| CONTROLLER HOUSING MOTHERBOARD INTERFACE SLOT PINOUT (SLOTS 2-6) | |
|---|---|
| 1. B+ OUT (DB10) | 32. DGND (DB25) POWER |

CONTROLLER HOUSING MOTHERBOARD INTERFACE SLOT PINOUT (SLOTS 2-6)

| | | |
|---|---|---|
| 2. SEL 0 | 33. SEL 1 | |
| 3. SEL 2 | 34. SEL 3 | SELECT OUT |
| 4. SEL 4 | 35. SEL 5 | |
| 5. SEL 6 | 36. SEL 7 | |
| 6. SK | 37. SO | SERIAL I/O |
| 7. SI | 38. SOD | |
| 8. D0 | 39. D1 | |
| 9. D2 | 40. D3 | |
| 10. D4 | 41. D5 | PARALLEL INPUTS |
| 11. D6 | 42. D7 | |
| 12. IO (POLL) | 43. NMI | |
| 13. INT 2 | 44. INT 3 | INTERRUPTS |
| 14. INT 4 | 45. EI | |
| 15. FUTURE | 46. CLKOUT | |
| 16. TS0 | 47. TS1 | |
| 17. TS2 | 48. TS3 | TIMERS |
| 18. T2IO | 49. T3IO | |
| 19. P0 | 50. P1 | INPUT CAPTURE |
| 20. P2 | 51. P3 | |
| 21. DB14 | 52. DB01 | |
| 22. DB15 | 53. DB02 | |
| 23. DB16 | 54. DB03 | |
| 24. DB17 | 55. DB04 | DB25 INTERFACE |
| 25. DB18 | 56. DB05 | |
| 26. DB19 | 57. DB06 | |
| 27. DB20 | 58. DB07 | |
| 28. DB21 | 59. DB08 | |
| 29. DB22 | 60. DB09 | |
| 30. MODTO (DB23) | 61. AGND (DB13) | POWER |
| 31. V+ (DB12) | 62. V− (DB24) | |

CONTROLLER HOUSING MOTHERBOARD INTERFACE SLOT PIN DESCRIPTIONS

| | | |
|---|---|---|
| 1. | [B+ OUT] | This pin supplies unregulated, filtered voltage from the battery. Typical voltages on this pin range from 10–15 volts DC. |
| 32. | [DGND] | Digital ground. This is the reference ground for logic circuitry. |
| 2. | [SEL 0] | Bit 0 (least significant bit) of the 8-bit module select port. Individual modules monitor this 8-bit port to determine if they are being addressed. |
| 33. | [SEL 1] | Bit 1 of the 8-bit module select port. Individual modules monitor this 8-bit port to determine if they are being addressed. |
| 3. | [SEL 2] | Bit 2 of the 8-bit module select port. Individual modules monitor this 8-bit port to determine if they are being addressed. |
| 34. | [SEL 3] | Bit 3 of the 8-bit module select port. Individual modules monitor this 8-bit port to determine if they are being addressed. |
| 4. | [SEL 4] | Bit 4 of the 8-bit module select port. Individual modules monitor this 8-bit port to determine if they are being addressed. |
| 35. | [SEL 5] | Bit 5 of the 8-bit module select port. Individual modules monitor this 8-bit port to determine if they are being addressed. |
| 5. | [SEL 6] | Bit 6 of the 8-bit module select port. Individual modules monitor this 8-bit port to determine if they are being addressed. |
| 36. | [SEL 7] | Bit 7 (most significant bit) of the 8-bit module select port. Individual modules monitor this 8-bit port to determine if they are being addressed. |
| 6. | [SK] | Serial communications synchronous clock. |
| 37. | [SO] | Serial communications delayed data output from the controller module. Data is delayed 8 SK clock cycles with respect to SOD. Normally data is shifted out MSB first. |
| 7. | [SI] | Serial communications input to the controller module. Normally, data is shifted in MSB first. |
| 38. | [SOD] | Serial communications direct data output from the controller module. Normally, data is shifted out MSB first. |
| 8. | [D0] | Bit 0 (least significant bit) of 8-bit parallel input port D. |
| 39. | [D1] | Bit 1 of 8-bit parallel input port D. |
| 9. | [D2] | Bit 2 of 8-bit parallel input port D. |
| 40. | [D3] | Bit 3 of 8-bit parallel input port D. |
| 10. | [D4] | Bit 4 of 8-bit parallel input port D. |
| 41. | [D5] | Bit 5 of 8-bit parallel input port D. |
| 11. | [D6] | Bit 6 of 8-bit parallel input port D. |
| 42. | [D7] | Bit 7 (most significant bit) of 8-bit parallel input port D. |
| 12. | [IO] | Poll. Normally, this line is pulled high by the controller module. When any module is selected via the SELECT port, this line goes low. The control module monitors this line to determine what modules are present in the system. |
| 43. | [NMI] | Non-maskable interrupt. Arbitration ranking 1 (Highest). |
| 13. | [INT 2] | Interrupt 2/Input capture 2. Arbitration ranking 2. |
| 44. | [INT 3] | Interrupt 3/Input capture 3. Arbitration ranking 3. |
| 14. | [INT 4] | Interrupt 4/Input capture 4. Arbitration ranking 4. |
| 45. | [EI] | External interrupt. Arbitration ranking 7 (Lowest). Normally, this interrupt is generated by the real-time clock on the controller module. |
| 15. | [FUTURE] | Reserved for future use. |
| 46. | [CLKOUT] | Programmable clock frequency generated by the real-time clock on the controller module. |
| 16. | [TS0] | Controller Timer 2 TS0 synchronous output. |
| 47. | [TS1] | Controller Timer 2 TS1 synchronous output. |
| 17. | [TS2] | Controller Timer 2 TS2 synchronous output. |
| 48. | [TS3] | Controller Timer 2 TS3 synchronous output. |
| 18. | [T2IO] | Controller Timer 2 output. |
| 49. | [T3IO] | Controller Timer 3 output. |
| 19. | [P0] | Bit 0 (least significant) of 4-bit general purpose output port P. May also be controlled by controller Timer 4. |
| 50. | [P1] | Bit 1 of 4-bit general purpose output port P. May also be controlled by controller Timer 5. |
| 20. | [P2] | Bit 2 of 4-bit general purpose output port P. May also be controlled by controller Timer 6. |
| 51. | [P3] | Bit 3 (most significant) of 4-bit general purpose output port P. May also be controlled by controller timer 7. |
| 21. | [DB14] | DB25 interface pin 14. Pin function defined by module plugged into associated slot. |
| 52. | [DB01] | DB25 interface pin 01. Pin function defined by module plugged into associated slot. |
| 22. | [DB15] | DB25 interface pin 15. Pin function defined by module plugged into associated slot. |
| 53. | [DB02] | DB25 interface pin 02. Pin function defined by module plugged into associated slot. |
| 23. | [DB16] | DB25 interface pin 16. Pin function defined by module plugged into associated slot. |
| 54. | [DB03] | DB25 interface pin 03. Pin function defined by module plugged into associated slot. |
| 24. | [DB17] | DB25 interface pin 17. Pin function defined by module plugged into associated slot. |
| 55. | [DB04] | DB25 interface pin 04. Pin function defined by module plugged into associated slot. |
| 25. | [DB18] | DB25 interface pin 18. Pin function defined by module plugged into associated slot. |
| 56. | [DB05] | DB25 interface pin 05. Pin function defined by module plugged into associated slot. |
| 26. | [DB19] | DB25 interface pin 19. Pin function defined by module plugged into associated slot. |
| 57. | [DB06] | DB25 interface pin 06. Pin function defined by module plugged into associated slot. |
| 27. | [DB20] | DB25 interface pin 20. Pin function defined by module plugged into associated slot. |
| 58. | [DB07] | DB25 interface pin 07. Pin function defined by module plugged into associated slot. |
| 28. | [DB21] | DB25 interface pin 21. Pin function defined by module plugged into associated slot. |
| 59. | [DB08] | DB25 interface pin 08. Pin function defined by module plugged into associated slot. |
| 29. | [DB22] | DB25 interface pin 22. Pin function defined by module plugged into associated slot. |
| 60. | [DB09] | DB25 interface pin 09. Pin function defined by module plugged into associated slot. |
| 30. | [MODTO] | Module Turn On. This line provides switched B+. This line is also connected to DB25 inter- |

CONTROLLER HOUSING MOTHERBOARD INTERFACE SLOT PIN DESCRIPTIONS

| | | |
|---|---|---|
| | | face pin 23. |
| 61. | [AGND] | Analog ground. Analog circuitry is referenced to this ground. This line is also connected to DB25 interface pin 13. |
| 31. | [V+] | Analog positive rail voltage. This unregulated voltage is generated by the switching power supply on the PSM module and typically varies between +16 and +20 volts DC with respect to AGND. This line is also connected to DB25 interface pin 12. |
| 62. | [V−] | Analog negative rail voltage. This unregulated voltage is generated by the switching power supply on the power supply module and typically varies between −16 and −20 volts DC with respect to AGND. This line is also connected to DB25 interface pin 24. |

CONTROLLER HOUSING MOTHERBOARD SIGNAL PROCESSOR SLOT PINOUT (SLOTS 7-12)

| | | | | |
|---|---|---|---|---|
| 1. | B+ OUT | 32. | DGND (DB25) | POWER |
| 2. | SEL 0 | 33. | SEL 1 | |
| 3. | SEL 2 | 34. | SEL 3 | SELECT OUT |
| 4. | SEL 4 | 35. | SEL 5 | |
| 5. | SEL 6 | 36. | SEL 7 | |
| 6. | SK | 37. | SO | SERIAL I/O |
| 7. | SI | 38. | SOD | |
| 8. | D0 | 39. | D1 | |
| 9. | D2 | 40. | D3 | PARALLEL INPUTS |
| 10. | D4 | 41. | D5 | |
| 11. | D6 | 42. | D7 | |
| 12. | IO (POLL) | 43. | NMI | |
| 13. | SRC1-L | 44. | SRC1-R | |
| 14. | SRC2-L | 45. | SRC2-R | |
| 15. | SEL-L | 46. | SEL-R | SOURCE BUSSES |
| 16. | SRC3-L | 47. | SRC3-R | |
| 17. | SRC4-L | 48. | SRC4-R | |
| 18. | FL IN | 49. | FR IN | SIGNAL FROM |
| 19. | BL IN | 50. | BR IN | PREVIOUS MODULE |
| 20. | FL OUT (DB14) | 51. | FR OUT (DB01) | SIGNAL TO |
| 21. | BL OUT (DB15) | 52. | BR OUT (DB02) | NEXT MODULE |
| 22. | DB16 | 53. | DB03 | |
| 23. | DB17 | 54. | DB04 | |
| 24. | DB18 | 55. | DB05 | |
| 25. | DB19 | 56. | DB06 | DB25 INTERFACE |
| 26. | DB20 | 57. | DB07 | |
| 27. | DB21 | 58. | DB08 | |
| 28. | DB22 | 59. | DB09 | |
| 29. | DB23 | 60. | DB10 | |
| 30. | MODT0 | 61. | AGND (DB13) | POWER |
| 31. | V+ (DB12) | 62. | V− (DB24) | |

CONTROLLER HOUSING MOTHERBOARD SIGNAL PROCESSOR SLOT PIN DESCRIPTIONS

| | | |
|---|---|---|
| 1. | [B+ OUT] | This pin supplies unregulated, filtered voltage from the battery. Typical voltages on this pin range from 10-15 volts DC. |
| 32. | [DGND] | Digital ground. This is the reference ground for logic circuitry. |
| 2. | [SEL O] | Bit 0 (least significant bit) of the 8-bit module select port. Individual modules monitor this 8-bit port to determine if they are being addressed. |
| 33. | [SEL 1] | Bit 1 of the 8-bit module select port. Individual modules monitor this 8-bit port to determine if they are being addressed. |
| 3. | [SEL 2] | Bit 2 of the 8-bit module select port. Individual modules monitor this 8-bit port to determine if they are being addressed. |
| 34. | [SEL 3] | Bit 3 of the 8-bit module select port. Individual modules monitor this 8-bit port to determine if they are being addressed. |
| 4. | [SEL 4] | Bit 4 of the 8-bit module select port. Individual modules monitor this 8-bit port to determine if they are being addressed. |
| 35. | [SEL 5] | Bit 5 of the 8-bit module select port. Individual modules monitor this 8-bit port to determine if they are being addressed. |
| 5. | [SEL 6] | Bit 6 of the 8-bit module select port. Individual modules monitor this 8-bit port to determine if they are being addressed. |
| 36. | [SEL 7] | Bit 7 (most significant bit) of the 8-bit module select port. Individual modules monitor this 8-bit port to determine if they are being addressed. |
| 6. | [SK] | Serial communications synchronous clock. |
| 37. | [SO] | Serial communications delayed data output from the controller module. Data is delayed 8 SK clock cycles with respect to SOD. Normally, data is shifted out MSB first. |
| 7. | [SI] | Serial communications input to the controller module. Normally, data is shifted in MSB first. |
| 38. | [SOD] | Serial communications direct data output from the controller module. Normally, data is shifted out MSB first. |
| 8. | [D0] | Bit 0 (least significant bit) of 8-bit parallel input port D. |
| 39. | [D1] | Bit 1 of 8-bit parallel input port D. |
| 9. | [D2] | Bit 2 of 8-bit parallel input port D. |
| 40. | [D3] | Bit 3 of 8-bit parallel input port D. |
| 10. | [D4] | Bit 4 of 8-bit parallel input port D. |
| 41. | [D5] | Bit 5 of 8-bit parallel input port D. |
| 11. | [D6] | Bit 6 of 8-bit parallel input port D. |
| 42. | [D7] | Bit 7 (most significant bit) of 8-bit parallel input port D. |
| 12. | [IO] | Poll. Normally, this line is pulled high by the controller module. When any module is selected via the SELECT port, this line goes low. The controller module monitors this line to determine what modules are present in the system. |
| 43. | [NMI] | Non-maskable interrupt. Arbitration ranking 1 (Highest). |
| 13. | [SRC1-L] | Audio source 1 - left channel. Normally, the left channel of source 1 is applied to this bus by the Preamp module. |
| 44. | [SRC1-R] | Audio source 1 - right channel. Normally, the right channel of source 1 is applied to this bus by the Preamp module. |
| 14. | [SRC2-L] | Audio source 2 - left channel. Normally, the left channel of source 2 is applied to this bus by the Preamp module. |
| 45. | [SRC2-R] | Audio source 2 - right channel. Normally, the right channel of source 3 is applied to this bus by the Preamp module. |
| 15. | [SEL-L] | Selected source bus - left channel. Normally, when the preamp module selects an input, the left channel of the selected source is applied to this bus. |
| 46. | [SEL-R] | Selected source bus - right channel. Normally, when the preamp module selects an input, the right channel of the selected source is applied to this bus. |
| 16. | [SRC3-L] | Audio source 3 - left channel. Normally, the left channel of source 3 is applied to this bus by the Preamp module. |
| 47. | [SRC3-R] | Audio source 3 - right channel. Normally, the right channel of source 3 is applied to this bus by the Preamp module. |
| 17. | [SRC4-L] | Audio source 4 - left channel. Normally, the left channel of source 4 is applied to this bus by the Preamp module. |
| 48. | [SRC4-R] | Audio source 4 - right channel. Normally, the right channel of source 4 is applied to this bus by the Preamp module. |
| 18. | [FL IN] | Front left audio loop input from previous module. |
| 49. | [FR IN] | Front right audio loop input from previous module. |
| 19. | [BL IN] | Back left audio loop input from previous module. |
| 50. | [BR IN] | Back right audio loop input from previous module. |
| 20. | [FL OUT] | Front left audio loop output to next module and DB25 interface pin 14. |

-continued

CONTROLLER HOUSING MOTHERBOARD SIGNAL PROCESSOR SLOT PIN DESCRIPTIONS

| | | |
|---|---|---|
| 51. | [FR OUT] | Front right audio loop output to next module and DB25 interface pin 01. |
| 21. | [BL OUT] | Back left audio loop output to next module and DB25 interface pin 15. |
| 52. | [BR OUT] | Back right audio loop output to next module and DB25 interface pin 02. |
| 22. | [DB16] | DB25 interface pin 16. Pin function defined by module plugged into associated slot. |
| 53. | [DB03] | DB25 interface pin 03. Pin function defined by module plugged into associated slot. |
| 23. | [DB17] | DB25 interface pin 17. Pin function defined by module plugged into associated slot. |
| 54. | [DB04] | DB25 interface pin 04. Pin function defined by module plugged into associated slot. |
| 24. | [DB18] | DB25 interface pin 18. Pin function defined by module plugged into associated slot. |
| 55. | [DB05] | DB25 interface pin 05. Pin function defined by module plugged into associated slot. |
| 25. | [DB19] | DB25 interface pin 19. Pin function defined by module plugged into associated slot. |
| 56. | [DB06] | DB25 interface pin 06. Pin function defined by module plugged into associated slot. |
| 26. | [DB20] | DB25 interface pin 20. Pin function defined by module plugged into associated slot. |
| 57. | [DB07] | DB25 interface pin 07. Pin function defined by module plugged into associated slot. |
| 27. | [DB21] | DB25 interface pin 21. Pin function defined by module plugged into associated slot. |
| 58. | [DB08] | DB25 interface pin 08. Pin function defined by module plugged into associated slot. |
| 28. | [DB22] | DB25 interface pin 22. Pin function defined by module plugged into associated slot. |
| 59. | [DB09] | DB25 interface pin 09. Pin function defined by module plugged into associated slot. |
| 29. | [DB23] | DB25 interface pin 23. Pin function defined by module plugged into associated slot. |
| 60. | [DB10] | DB25 interface pin 10. Pin function defined by module plugged into associated slot. |
| 30. | [MODTO] | Module Turn On. This line provides switched B+. |
| 61. | [AGND] | Analog ground. Analog circuitry is referenced to this ground. This line is also connected to DB25 interface pin 13. |
| 31. | [V+] | Analog positive rail voltage. This unregulated voltage is generated by the switching power supply on the power supply module and typically varies between +16 to +20 volts DC with respect to AGND. This line is also connected to DB25 interface pin 12. |
| 62. | [V−] | Analog negative rail voltage. This unregulated voltage is generated by the switching power supply on the power supply module and typically varies between −16 to −20 volts DC with respect to AGND. This line is also connected to DB25 interface pin 24. |

Finally, a socket 66 is provided for connection of the controller housing 12 to the power supply system of the vehicle 18 in which the system 10 is mounted.

B. Signal Processing Cards (Audio Modules)

An exemplary audio component card 70 is illustrated in FIGS. 2, 4, and 6–7 and designated 70. The system includes a circuit board or card 72 and a face plate 74. The card 72 is generally rectangular and includes a front end 76 mechanically connected to the face plate 74, for example by way of brackets 77 and screws 78. Card 72 also includes a rear end 80 terminating in a plug portion 82 supporting a plurality of electrical leads 84. A plurality of electrical devices or circuit components 84 are mounted on the card 72 to provide a desired function for the card as will be described. The components are electrically connected together and electrically connected to the leads 84 to provide both digital communication with the control module and audio signal processing.

The face plate 74 is preferably fabricated of aluminum. A grip 88 is connected to the front face of the plate 74 to provide a grasp facilitating insertion into, and removal of the card from, the amplifier housing 12. The face plate 74 also supports a pair of thumb screws 90 for securing the card in position within the controller housing 12. The face plate may contain LED's 91 or other visual indicators to provide information regarding the status or operation of the module.

Figure 4:
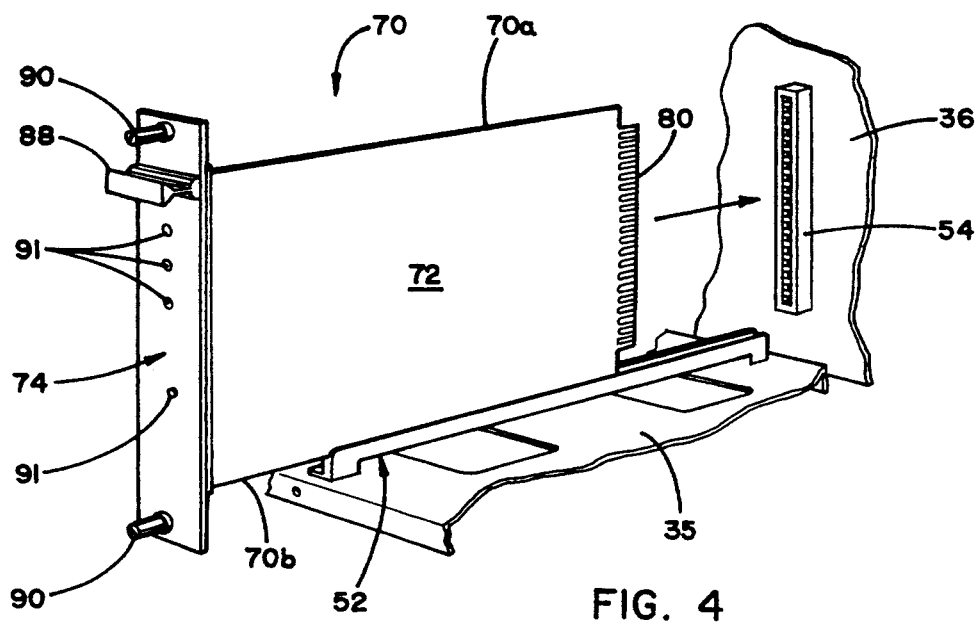
FIG. 4 is a fragmentary perspective view showing a single component card partially installed within the controller housing.
Figure 6:
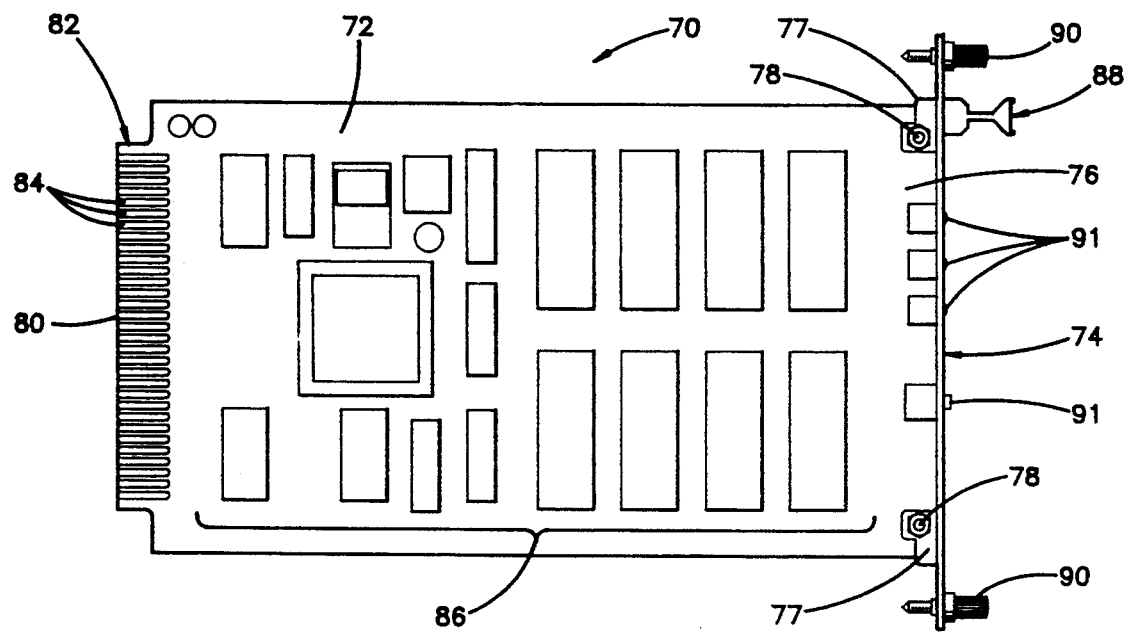
FIG. 6 is a side elevational view of a component card.

Installation and retention of the audio cards 70 within the control housing 12 is illustrated in FIGS. 2 and 4. Generally speaking, the upper and lower edges 70a and 70b, respectively, of the card are slidably received within the upper and lower tracks 52. Cards are installed into the chamber 44 through the front face of the controller housing. The upper and lower board edges 70a and b are positioned within a vertically aligned pair of tracks 52 and the card is slid and/or pushed rearwardly into the case. As insertion of the card is completed, the plug end 80 fits within the associated socket 54 so that the electrical leads 84 (see FIG. 4) are electrically connected to the contacts within the socket. This contact provides both digital and audio connections to the digital and audio buses as necessary for the card. When the plug end 80 is fully inserted within the socket 54, the face plate 74 abuts the forward edges of the upper and lower chassis 31 and 35. The thumb screws 90 are then rotated and tightened into the holes 92 to secure the board in position.

The cards developed and/or anticipated to date include the following:

Power Supply Module (Interface Slot #1)

The power supply module (power supply) provides the voltages necessary to operate the other modules inserted into the controller housing. A high-voltage power supply guarantees plenty of headroom for the signal processing modules. The power supply is an essential component within the system.

Audio ground is isolated from the chassis ground of the vehicle. This helps to reduce the possibility of engine noise. Pi filters are also incorporated into the module to improve the signal-to-noise ratio and reduce supply "hash."

Controller Module (Interface Slot #2)

The controller module is the brains behind the system and controls every aspect of the system operation. The controller module features a 16-bit controller running at 16 MHz. It comes with 8k of static ram and 8k of PROM. There are five sockets available (40K) for future releases of system software, which may be installed simply by adding PROM chips. Other features include a real-time clock and an RS-232 serial interface. By utilizing assembly language programming, the software operates at a maximum efficiency with a minimum amount of overhead. The controller module is an essential component in any system configuration.

Preamplifier Module (Signal Processor Slot)

The preamplifier module features four user-selectable, balanced stereo inputs. The preamp is also an essential component within the system. Outputs are provided for front left, front right, back left, and back right. Volume is controlled from a dedicated volume control on the remote data access terminal and may be varied over an 80 dB range. Bass and treble can be boosted or cut by 12 dB at 45 Hz and 15 kHz respectively. Balance and fade functions are also available.

The user is allowed to save up to four acoustic settings (fader and balance positions, bass and treble settings). On power-up, the controller instructs the preamp to slowly increase the volume until it is at the same level as when the system was turned off.

One interesting feature of the SYMMETRY system is that multiple identical cards can be used within the same system. Since more than one preamp module can be used, multiple zone applications can be created. For instance, the driver can be listening to one source over the system's speakers while the passengers in the back are listening to another source over their headphones. Four preamp cards would give the user one zone with 16 sources to select from or four zones with four sources each.

Missing Link Transmitter

One of the biggest problems in car audio is noise. Ignition noise, fan motors, and alternator whine are Just a few of the obstacles which must be overcome in a typical autosound installation. The missing link transmitter (MLT) is an extension of the preamplifier module. It accepts up to four stereo inputs, each of which is then immediately converted to a fully balanced differentially driven output. These outputs, similar to the ones used in recording studios, are then amplified to approximately 30 volts peak-to-peak and then routed to the preamp module via a multi-conductor cable.

The missing link transmitter is located as close to the source unit as possible to obtain the lowest possible noise figure. Because the output of the MLT is fully balanced, any noise induced into the cable between the MLT and the preamp module will be eliminated due to common mode rejection. In addition, by amplifying the signal at the MLT and then reducing it back to unity at the preamp, any noise that escapes the common mode rejection will be reduced at the same time the signal is reduced to unity at the preamp.

DSP Module (Signal Processor Slot)

Another problem with autosound installations is the acoustics of the vehicle. The Digital Signal Processor (DSP) attacks this problem on a most fundamental level. Instead of trying to mask the acoustic problems of the environment with echo, reverb, and the like, the DSP removes the acoustic anomalies of the vehicle entirely.

Because the acoustics of every vehicle are different, it is impossible to ship a DSP unit with a "canned" set of error correcting coefficients. Instead, the DSP comes with it's own microphone which my be installed in the vehicle permanently or on a temporary basis. Once installed, the user will be required to go through a 60-second set-up process. During this process, the DSP module will play pink noise from each of the system's stereo channels. Since the DSP unit is generating the pink noise and also measuring it with a microphone, any difference it "hears" between what it is sending and what it is receiving is known as error or distortion. This error may be caused by reflections within the car, standing waves, phasing problems between the drivers, deficiencies in the drivers themselves, time alignment problems and a host of other concerns. Once the DSP unit identifies what these acoustic anomalies are, it creates a set of coefficients that represent the inverse of the error or "anti-error." This anti-error is then recombined with the program material to effectively deconvolve or remove the acoustic problems within the listening environment.

Equalizer Module (Signal Processor Slot)

The equalizer is a fourteen-band stereo equalizer with center frequencies established at 30, 45, 60, 90, 125, 180, 250, 375, 500, 1k, 2k, 4k, 8k, and 16 kHz. With center frequencies at half octave intervals below 500 Hz, the equalizer offers superb adjustment of bass and mid-bass frequencies, splitting the difference between the typical third-octave and octave equalizers. The equalizer allows the user to store up to four different frequency response curves in memory. These different curves may be used to listen at different loudness levels or to compensate for window closure and other vehicle variations. The equalizer allows for a maximum of 12 dB boost or cut. All equalization commands are executed with the RDAT.

16-Channel Crossover (Signal Processor Slot)

The electronic crossover module is one of the most versatile crossovers ever created. It takes the four preamp outputs and divides these signals into the following 16 outputs: Front Left and Right Highpass, Front Left and Right Bandpass 1, Front Left and Right Bandpass 2, Back Left and Right Highpass, Back Left and Right Bandpass 1, Back Left and Right Bandpass 2, Left and Right Constant Bass Lowpass, Summed Mono Constant Bass Lowpass, and Front Center Channel Bandpass Each of the 16 outputs can be dynamically programmed via the remote data access terminal to one of 256 possible crossover frequencies.

Wiring the output of the crossover module to the input of the amplifier housing is relatively simple. Instead of 10 stereo patch cables (16 crossover outputs+4 preamp outputs) as would typically be required, the system uses one standard DB25 cable, which is quick, easy, neat, and eliminates any chance of wiring error.

Security Interface Module (Interface Slot)

The security interface module consists of 8 input "zones" and 8 outputs. The inputs can be configured via the RDAT as active hi (Ford) or active low (General Motors) type inputs. Once a particular zone has been designated, the user is asked to identify the sensor type via the software (e.g. pin, shock, and uwave). Six of the module's outputs are preassigned to specific purposes (e.g. siren, ignition lockout, parking lights, and horn), while the remaining two outputs may be used as general purpose outputs by the user.

If the system incorporates an RF version of the RDAT, the vehicle will try to contact the user in the event of an alarm condition. For example, if an alert condition occurs, the controller will beep the RDAT and display a message such as "PERIMETER VIOLATION—PASSENGER DOOR" and then display the time the event occurred. Multiple events are recorded along with the time they occurred and sensor type and location.

Digital Output Module (Interface Slot)

The digital output module consists of 16 general purpose digital outputs that may be used for switching purposes (e.g. ignition, heater, and door locks). Used in conjunction with the relay assembly housing, the digital output module can switch 8 (optionally 16) relays, each up to a five-amp load, to accomplish just about anything imaginable. These outputs can be controlled manually via the RDAT or, automatically by using a macro control.

The RDAT software allows you to write macros which consist of a series of events and durations. For instance, on a cold winter morning, you could "play" a macro to start your car, turn on the heater after two minutes, unlock the doors, and, turn the radio on. Alternately, the macro can be played automatically at a preset time on a particular day.

FM Tuner/CD controller Module (Signal Processor Slot)

The FM tuner module allows the system to receive stereo FM broadcasts. In addition to standard presets, this tuner allows the user to scan an area for available stations and automatically program a bank of presets in the order of received signal strength. Presets can be categorized by music type (e.g. rock, jazz, country) as well as locale (e.g. Phoenix, Los Angeles, Chicago). In addition to the station's frequency, the station's call sign may be entered as well.

The FM tuner card is also capable of "emulating" the control signals of some of the more popular CD changers on the market. In this type of arrangement, a cable would connect between the I/O port corresponding to the FM tuner module on SYMMETRY to the remote commander jack on the CD changer. This allows the user to control the CD changer from the RDAT.

Loop Through Module (Signal Processor Slot)

The loop through module (LTM) is an output module which receives signals from the preamplifier and applies those signals to the output pins of the LTM module's DB25 connector on the back panel of the controller housing. The signal is then routed through a single DB25 cable to the amplifier housing.

Future Modules

Future anticipated modules for the system include the following:
  Video Interface Module
    Provides Test and Graphics Status of System
    Small, Compact, LCD Color Monitor
  Amplifier Housing Interface Module
    Checks Load Status Before Applying Power
    Monitors Outputs and Displays Output Power in Watts
    Monitors Temperature
    Enhances Protection Circuitry of Amplifiers
    Interfaces with speakers to monitor excursion
  Cellular Phone Interface Module
  Vehicular Interface Module
    Allows Computer to Monitor Vehicle Functions
    Tachometer input
    Speedometer input
    DC Volts input
    Oil Pressure input
    Water Temperature input
    Fuel Consumption input
    MPG, GPH, DTA, ETA, DTE, ETE, TTE and more Available
  Speech Synthesizer Module
  Radar Detector Module
  Alternator Regulator Module
  Vehicle Locator/Navigator Interface Module As can be seen, the system is (and will continue to be) capable of supporting non-audio electronic components (e.g. the Security Interface Module). Thus a single system is capable of providing control of virtually every vehicle function in both the audio and non-audio areas.

II. AMPLIFIER

A. Amplifier Housing

The amplifier housing is also expandable and modular. Up to four four-channel amplifiers may be installed into each amplifier housing. Multiple amplifier housings may be daisy-chained together for unlimited installation flexibility.

The amplifier housing 14 is illustrated in FIGS. 8-11. The general theory and concept of the amplifier housing 14 is similar to that of the controller housing 12 in that the housing slidably receives amplifier modules to provide a readily adaptable and interchangeable amplifier system. The amplifier housing 14 includes a top wall 110, a bottom wall 112, a pair of opposite side walls 114 and 116 and a rear wall 118. These walls define a chamber 120 within the amplifier housing 14 into which the amplifier modules are placed. A hinged door 121 with lock 123 is provided to limit access to the chamber 120 and any components mounted therein. Feet 146 are provided on the bottom wall 112 to support the amplifier housing 12 within a trunk or other location.

A pair of plexiglass chassis plates 122 and 124 are secured to the upper and bottom walls 110 and 112, respectively. The chassis plates define grooves or tracks 126 which receive the amplifier modules as will be described. Vent holes 128 are provided in the top and side walls of the amplifier housing 14 to permit air flow therethrough. Additionally, the chassis plates 122 and 124 each define a vent hole 130 generally aligned with each of the amplifier modules to provide an air-flow path directly onto the heat sink. The amplifier housing 14 defines four amplifier module slots or locations to receive an amplifier module. Each location is defined by a pair of vertically aligned tracks 126. A socket 150 is mounted within the chamber 120 on the rear wall 118, and one of the sockets is generally aligned with each amplifier module location.

A thermostatically controlled fan 132 is mounted within the rear wall 118 and provides forced-air ventilation. The fan 132 pressurizes the chamber 120 and therefore forces air out through each of the vent holes 130 to provide a cooling flow of air over each amplifier module. A thermistor (not shown) is mounted on the heat sink of each amplifier module, and the fan is responsive to the hottest such thermistor.

Figure 10:
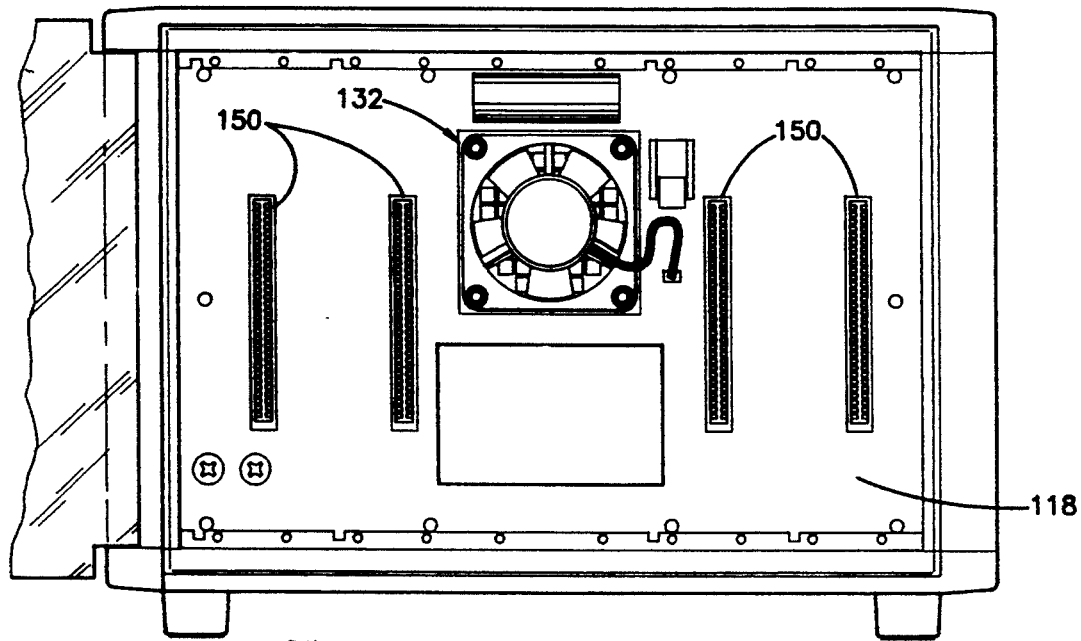
FIG. 10 is a front elevational view of the amplifier housing with all amplifier components removed.
Figure 11:
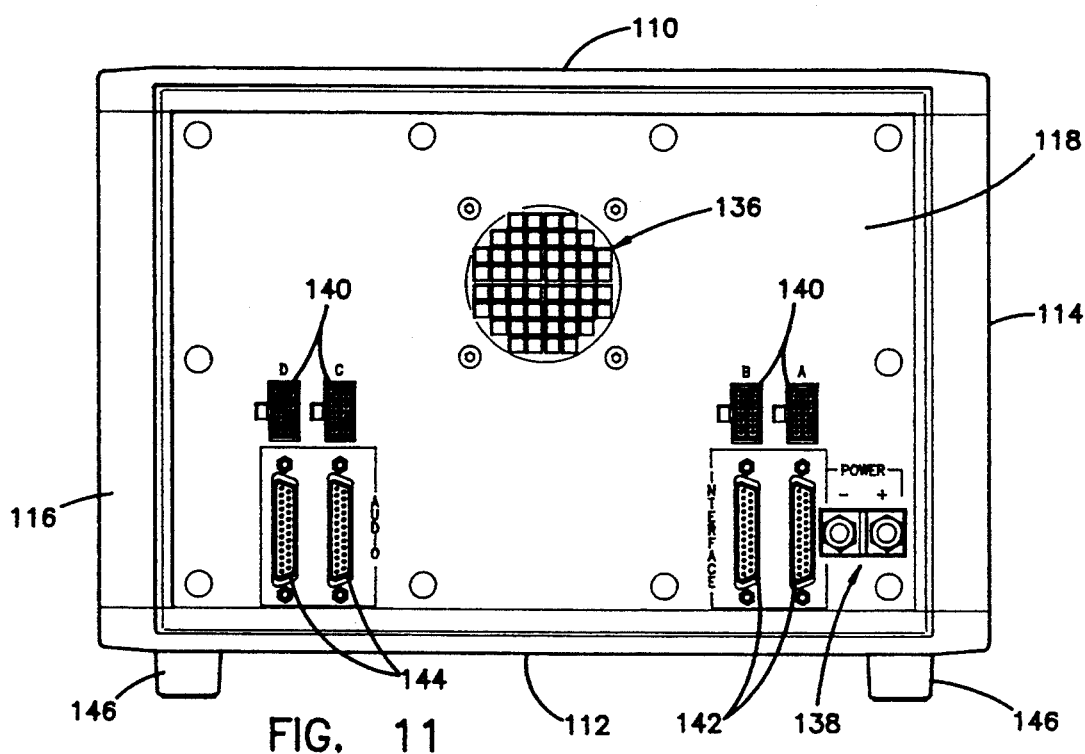
FIG. 11 is a rear elevational view of the amplifier housing.

An interior view of the rear wall 118 is provided in FIG. 10, and an exterior view of the rear wall is provided in FIG. 11. A grille 136 is integrally formed in the rear wall 118 to cover the fan 132. A pair of power terminals 138 are supported in the rear wall for connection to the power supply of the vehicle. Speaker jacks 140 are also supported in the rear wall to provide a means of interconnecting the car speakers with the system. Interface connectors 142 and audio connectors 144 are provided for interconnection with the controller module 12 via standard DB25 cables.

Figure 12:
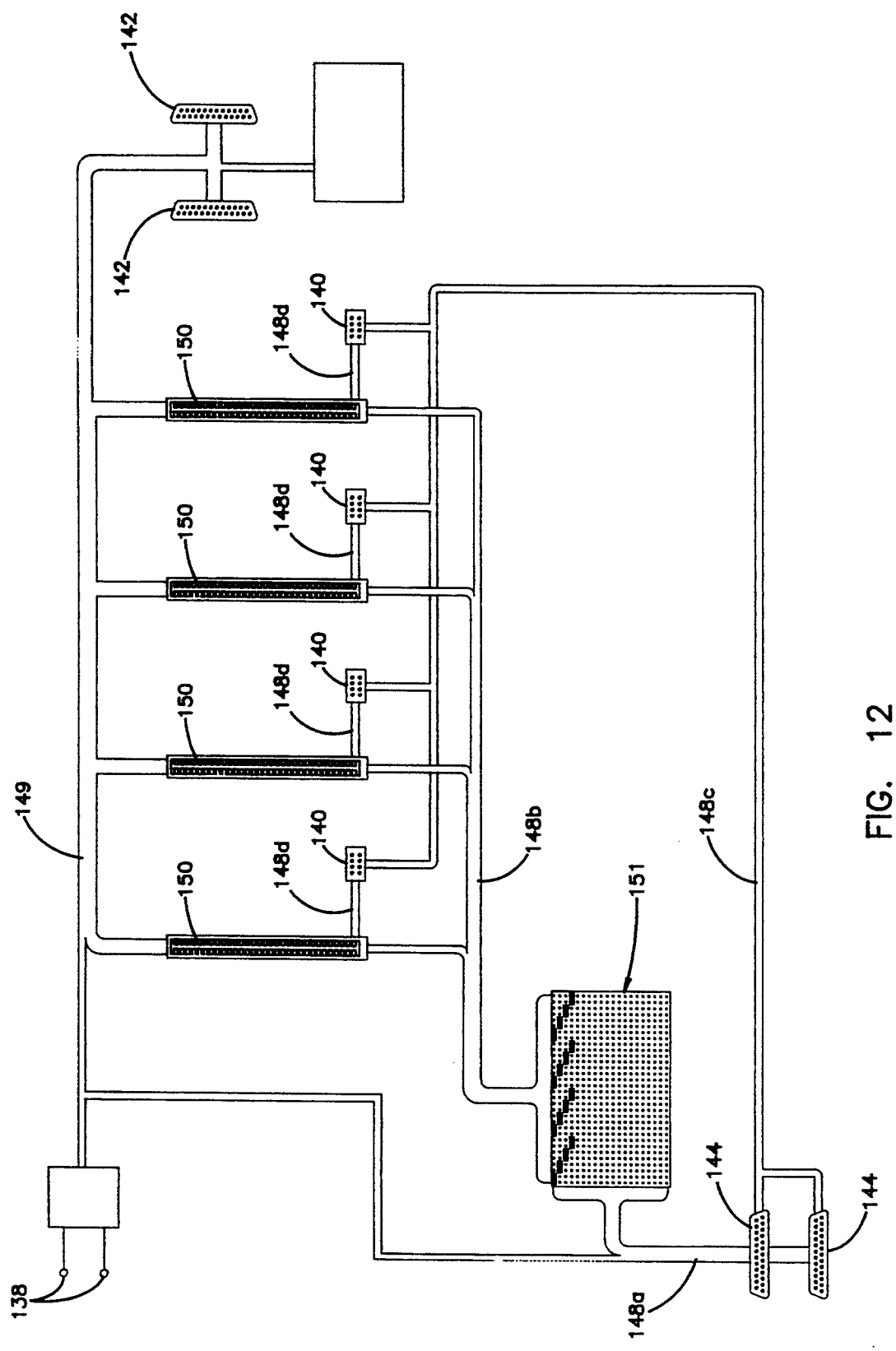
FIG. 12 is a schematic diagram of the amplifier housing mother board.

The amplifier housing motherboard 147 is passive and is illustrated in FIG. 12. The motherboard includes an audio signal bus portion 148 and an interface power bus portion 149. The audio signals received from the controller housing through ports 144 are routed to the amplifier sockets 150 through the configuration matrix via bus portions 148a and b. The amplified signals are delivered to the speaker jacks 140 via bus portions 148d. The digital control signals received from the controller housing through ports 142 are routed to the amplifier sockets 150 via the digital bus portion 149. The pin-out definitions for the amplifier motherboard 147 are as follows:

| AMPLIFIER HOUSING MOTHERBOARD AMPLIFIER SLOT PINOUT | | |
|---|---|---|
| 1. GND | 32. B+ | |
| 2. GND | 33. B+ | |
| 3. GND | 34. B+ | |
| 4. GND | 35. B+ | |
| 5. GND | 36. B+ | |
| 6. GND | 37. B+ | |
| 7. GND | 38. B+ | |
| 8. GND | 39. B+ | POWER |
| 9. GND | 40. B+ | |
| 10. GND | 41. B+ | |
| 11. GND | 42. B+ | |
| 12. GND | 43. B+ | |
| 13. GND | 44. B+ | |
| 14. GND | 45. B+ | |
| 15. GND | 46. B+ | |
| 16. AMPTO | 47. FAN | |
| 17. SK | 48. SO | INTERFACE |
| 18. SI | 49. +5 IN | |
| 19. ENABLE | 50. SELECT | |
| 20. OUT4 − (HOT) | 51. OUT4 − (HOT) | |
| 21. OUT4 + (AGND) | 52. OUT4 + (AGND) | |
| 22. OUT3 + (HOT) | 53. OUT3 + (HOT) | |
| 23. OUT3 − (AGND) | 54. OUT3 − (AGND) | SPEAKER OUTPUTS |
| 24. OUT2 − (HOT) | 55. OUT2 − (HOT) | |
| 25. OUT2 + (AGND) | 56. OUT2 + (AGND) | |
| 26. OUT1 + (HOT) | 57. OUT1 + (HOT) | |
| 27. OUT1 − (AGND) | 58. OUT1 − (AGND) | |
| 28. IN3 | 59. IN4 | |
| 29. AGND | 60. AGND | SIGNAL INPUTS |
| 30. IN1 | 61. IN2 | |
| 31. AGND | 62. AGND | |

| AMPLIFIER SLOT PIN DESCRIPTIONS | | |
|---|---|---|
| 1-15. | [GND] | Amplifier power ground. This ground is the reference for B+. |
| 32-46. | [B+] | Positive supply votage for the amplifier. Typically, this voltage varies between 10-15 volts DC with respect to GND. |
| 16. | [AMPTO] | Amplifier remote turn-on input. This line must be taken high (B+) in order to turn an amplifier on. |
| 47. | [FAN] | Cooling fan drive voltage. The voltage on this pin varies with the temperature of the amplifier and is used to control the cooling fan in the amplifier housing. |
| 17. | [SK] | Serial communications synchronous clock. |
| 46. | [SO] | Serial communications data output from the controller module. Normally, data is shifted OUT MSB first. |
| 18. | [SI] | Serial communications input to the controller module. Normally, data is shifted IN MSB first. |
| 49. | [+5 IN] | Regulated +5 volt supply. |
| 15. | [ENABLE] | Amplifier housing enable. This line goes low whenever the amplifier housing is being addressed. |
| 50. | [SELECT] | Amplifier select. This line goes high whenever an individual amplifier (1-4) is addressed. |
| 20. | [OUT4 −] | Negative speaker output for channel 4. |
| 51. | [OUT4 −] | Negative speaker output for channel 4. |
| 21. | [OUT4 +] | Positive speaker output for channel 4. |
| 52. | [OUT4 +] | Positive speaker output for channel 4. |

| AMPLIFIER SLOT PIN DESCRIPTIONS -continued | | |
|---|---|---|
| 22. | [OUT3 +] | Positive speaker output for channel 3. |
| 59. | [OUT3 +] | Positive speaker output for channel 3. |
| 23. | [OUT3 −] | Negative speaker output for channel 3. |
| 54. | [OUT3 −] | Negative speaker output for channel 3. |
| 24. | [OUT2 −] | Negative speaker output for channel 2. |
| 55. | [OUT2 −] | Negative speaker output for channel 2. |
| 25. | [OUT2 +] | Positive speaker output for channel 2. |
| 59. | [OUT2 +] | Positive speaker output for channel 2. |
| 25. | [OUT1 +] | Positive speaker output for channel 1. |
| 57. | [OUT1 +] | Positive speaker output for channel 1. |
| 27. | [OUT1 −] | Negative speaker output for channel 1. |
| 58. | [OUT1 −] | Negative speaker output for channel 1. |
| 20. | [IN3] | Channel 3 signal input. |
| 59. | [IN4] | Channel 4 signal input. |
| 29. | [AGND] | Analog ground. |
| 80. | [AGND] | Analog ground. |
| 30. | [IN1] | Channel 1 signal input. |
| 61. | [IN2] | Channel 2 signal input. |
| 31. | [AGND] | Analog ground. |
| 62. | [AGND] | Analog ground. |

Figure 13:
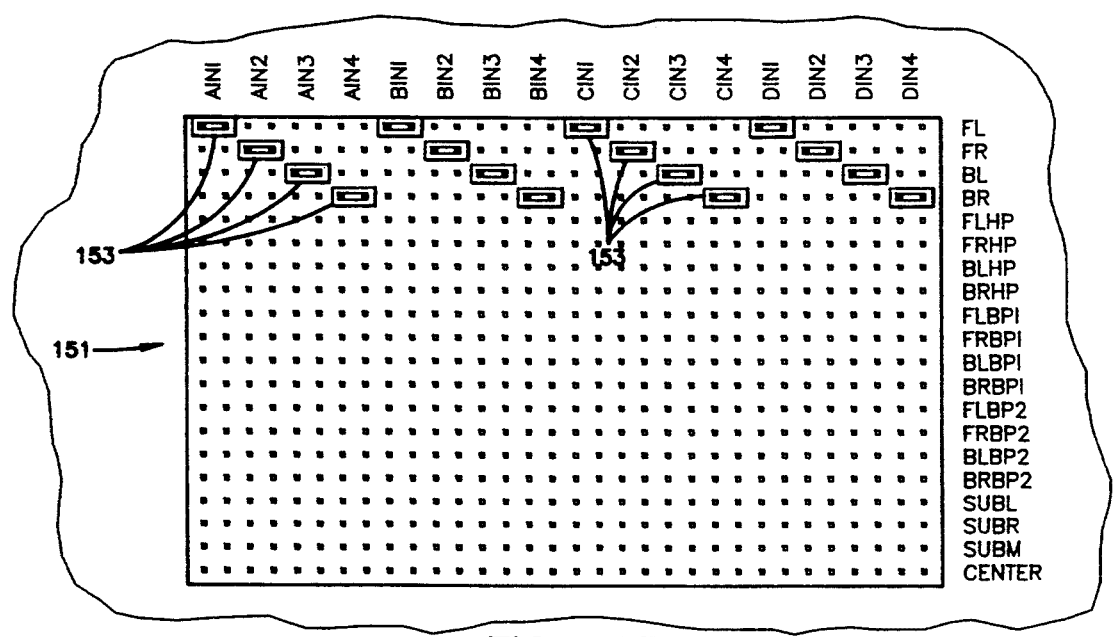
FIG. 13 is a front elevational view of the amplifier cross-bar configuration matrix.
Figure 18:
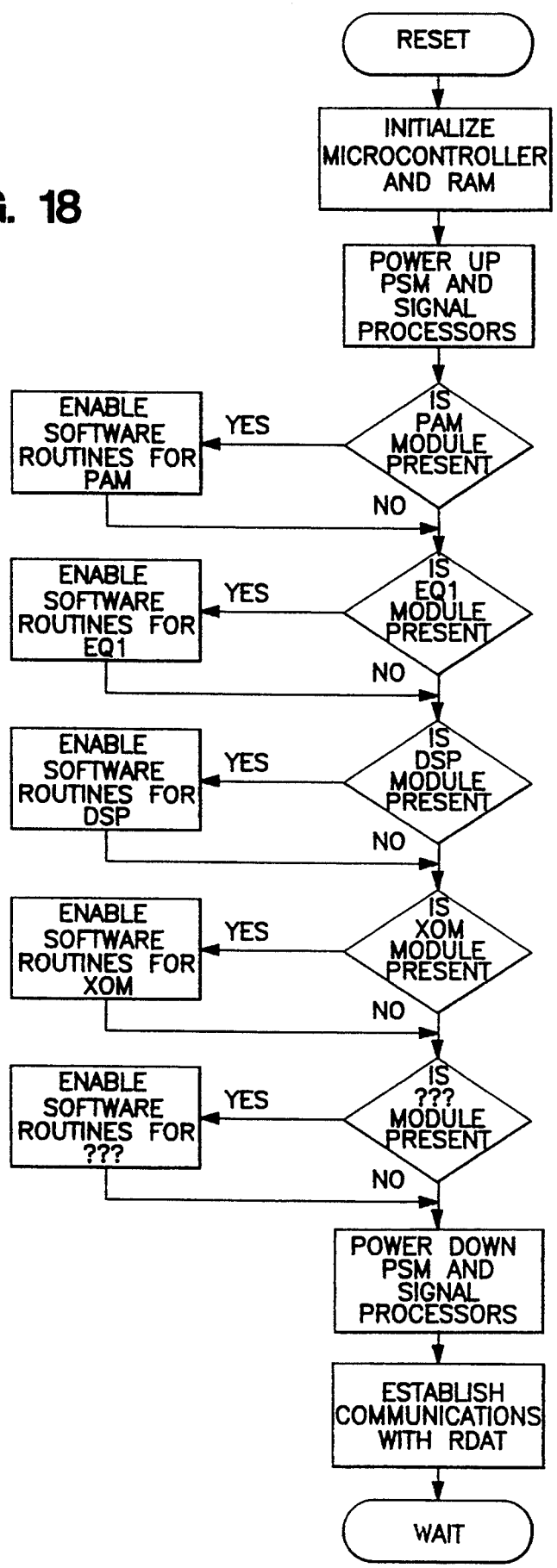
FIGS. 18-39 are flow charts setting forth the operation of the controller module with input/output through the RDAT.
Figure 19:
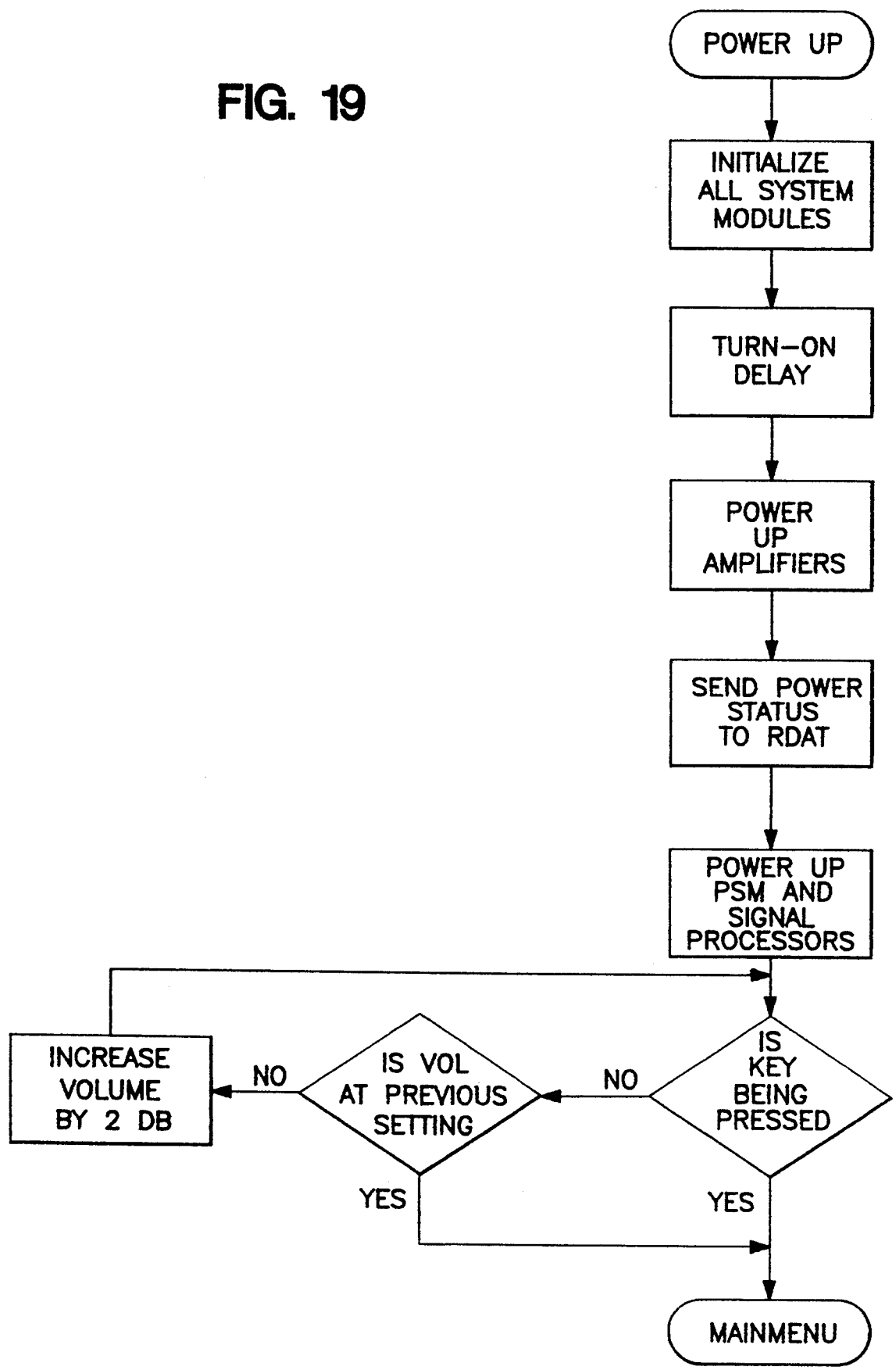
Figure 20:
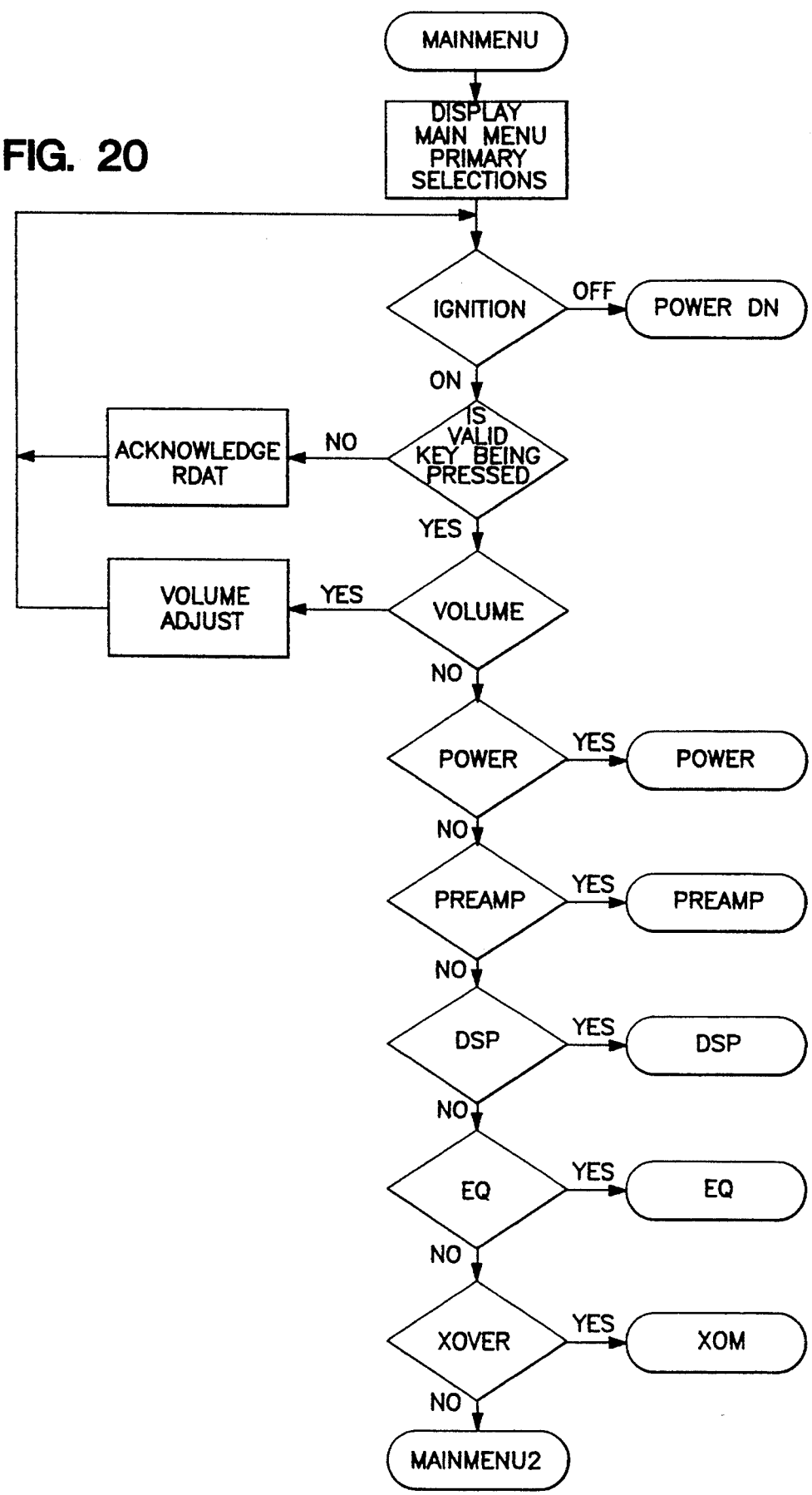
Figure 21:
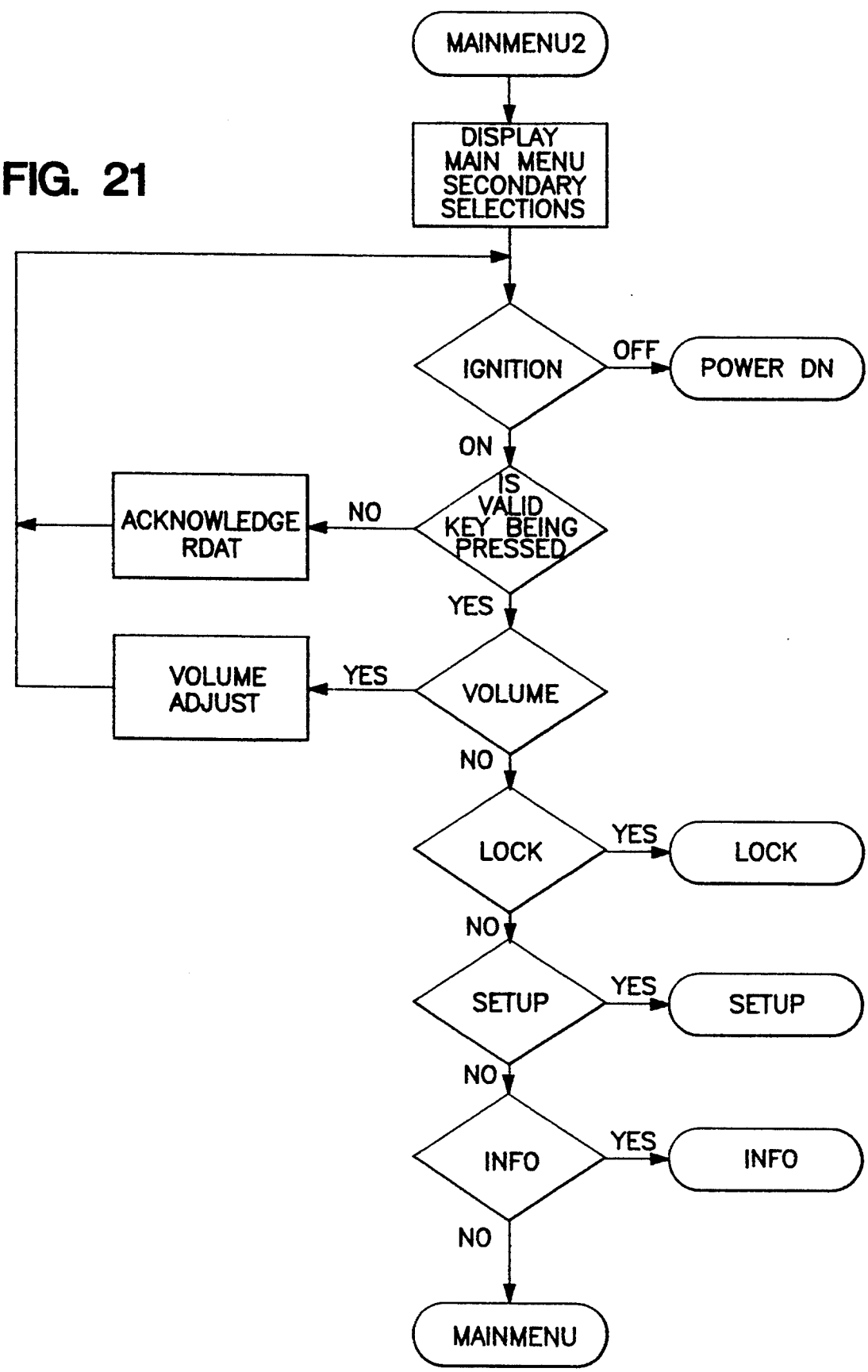
Figure 22:
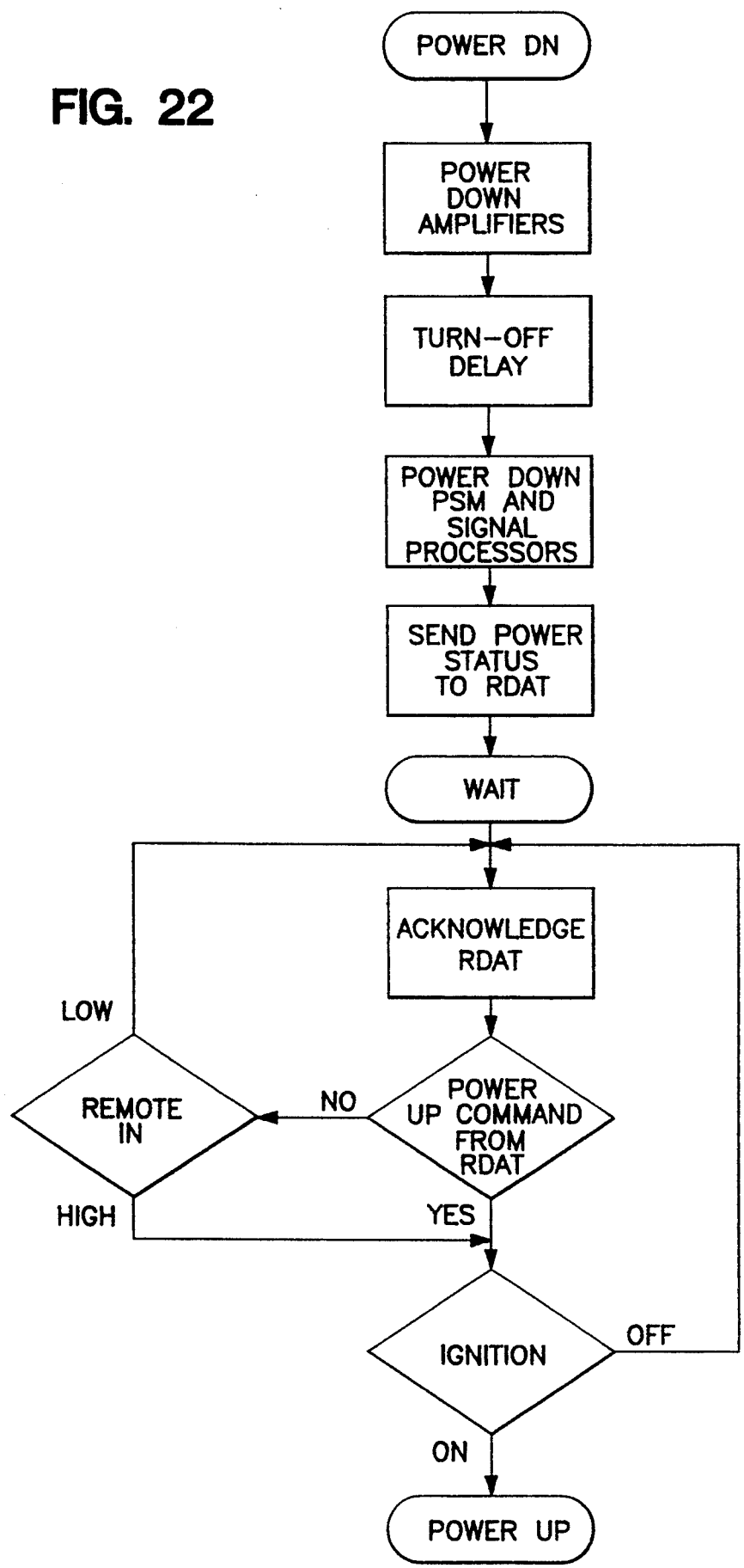
Figure 23:
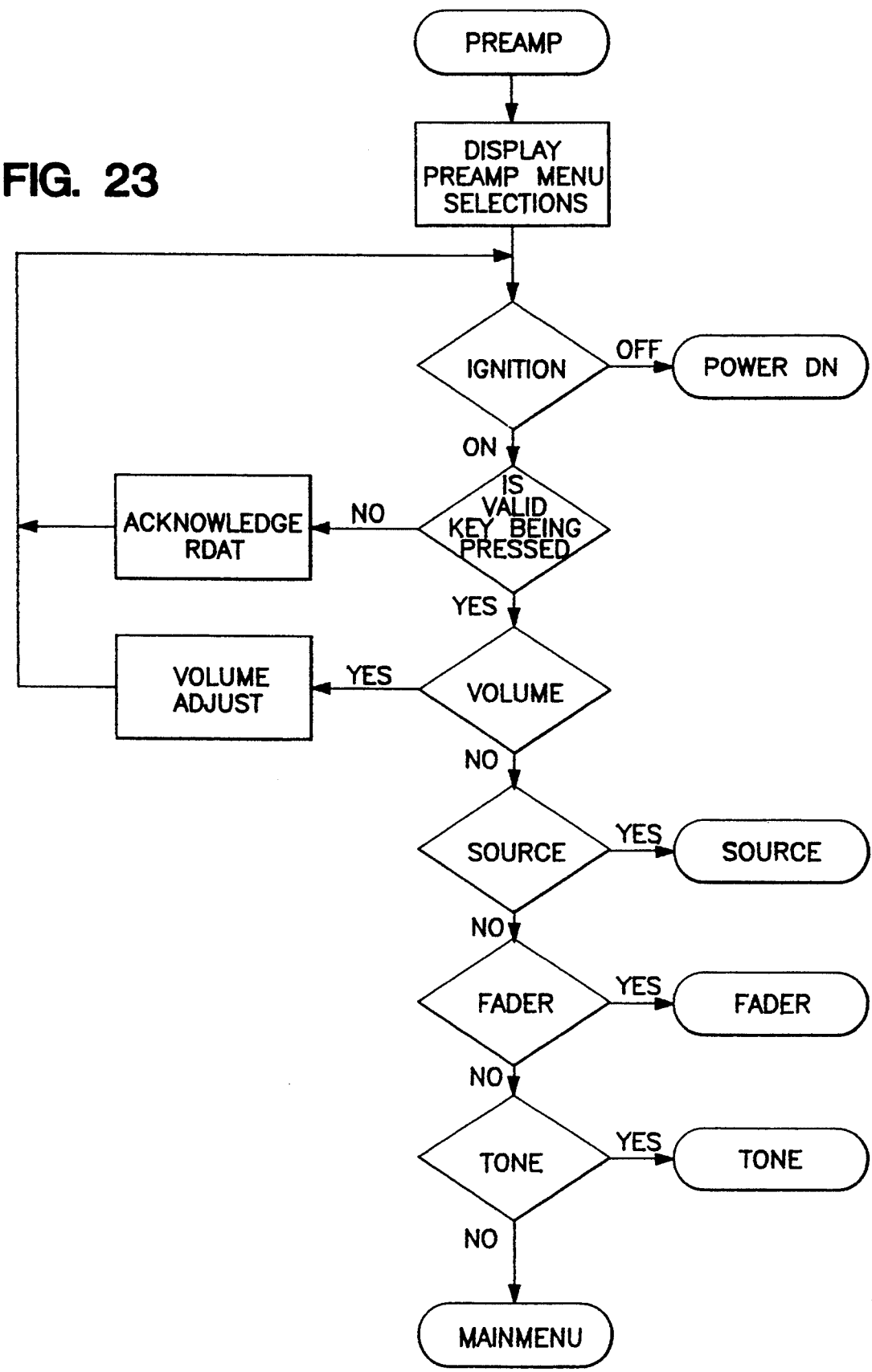
Figure 24:
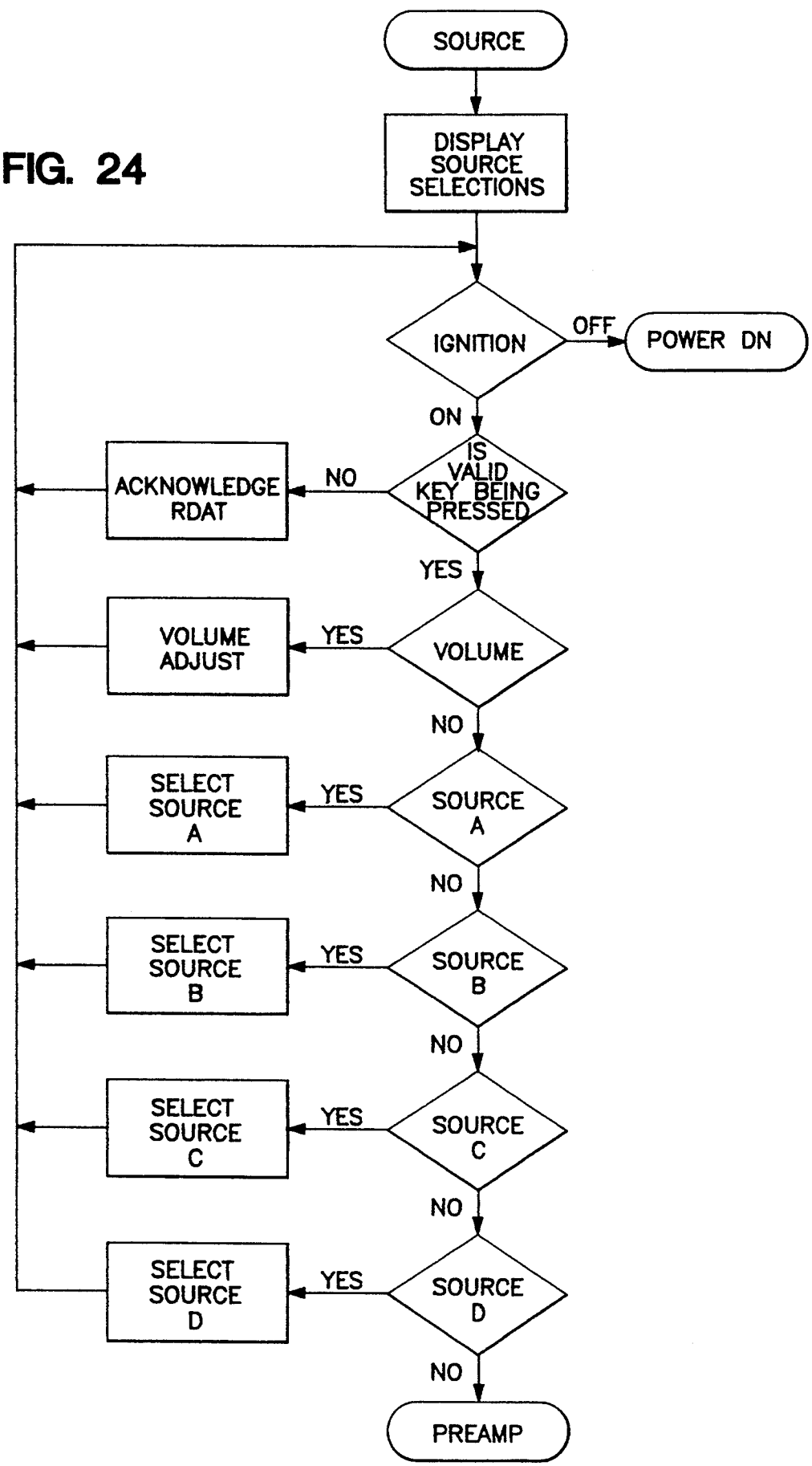
Figure 25:
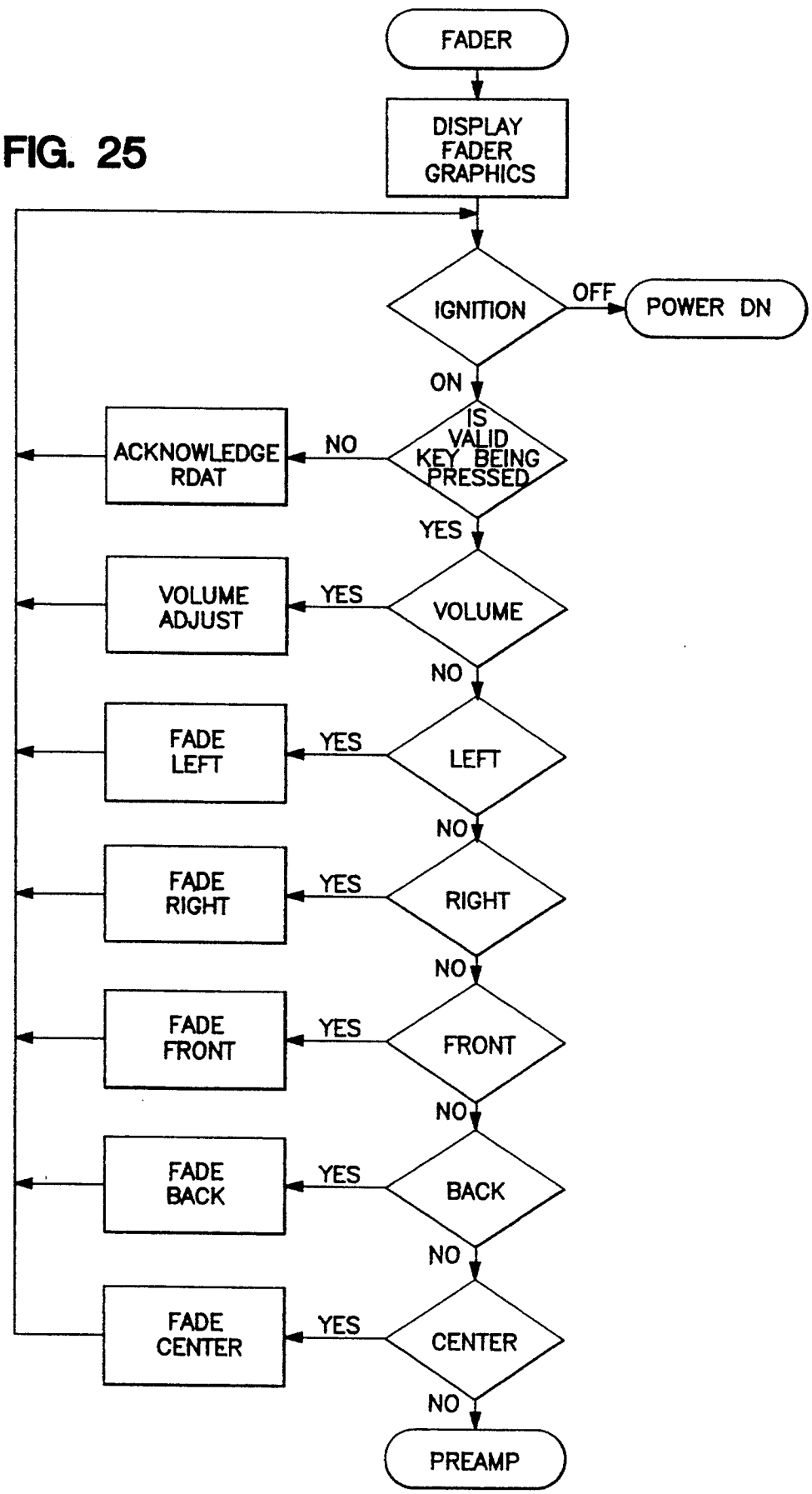
Figure 26:
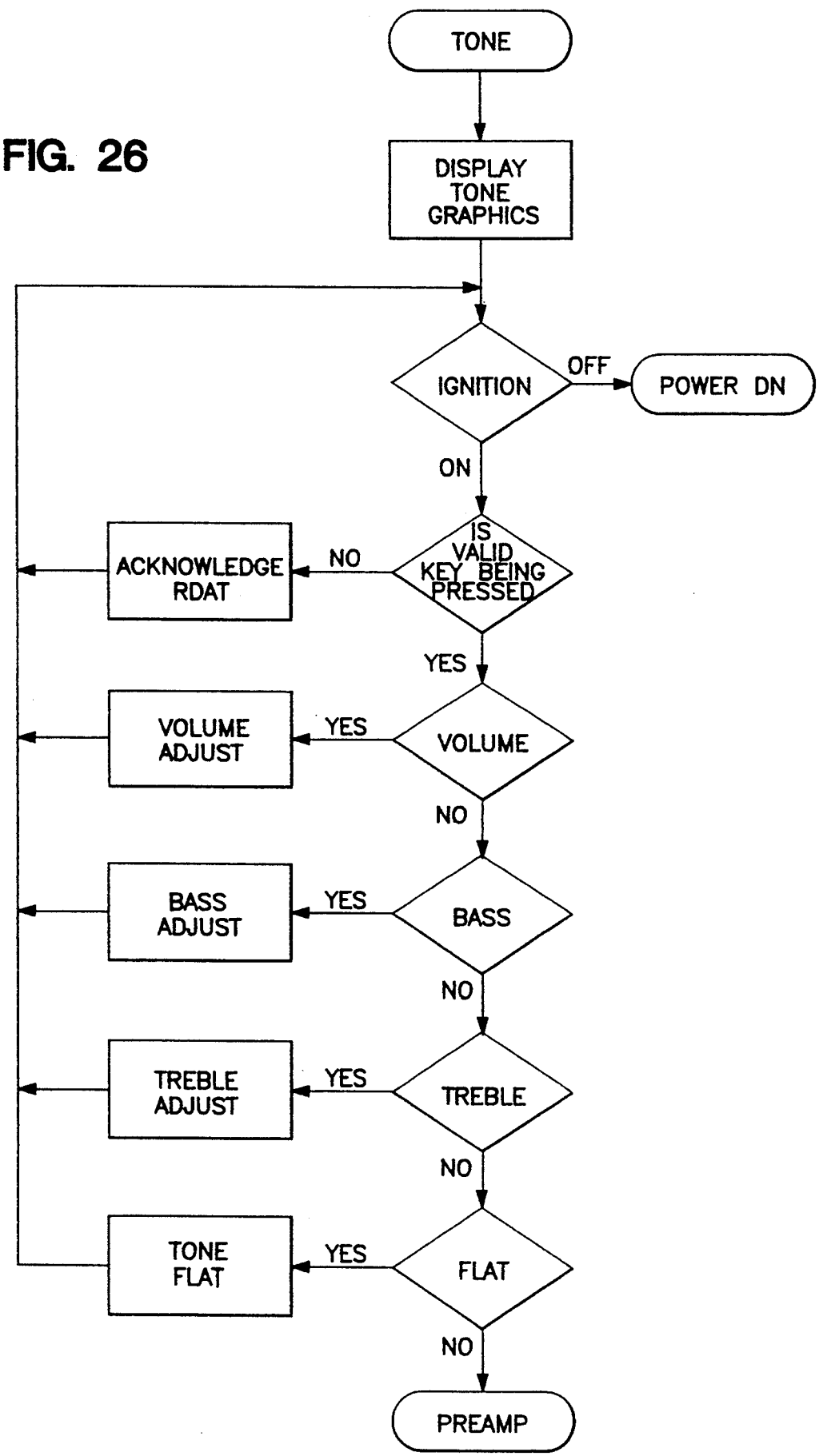
Figure 27:
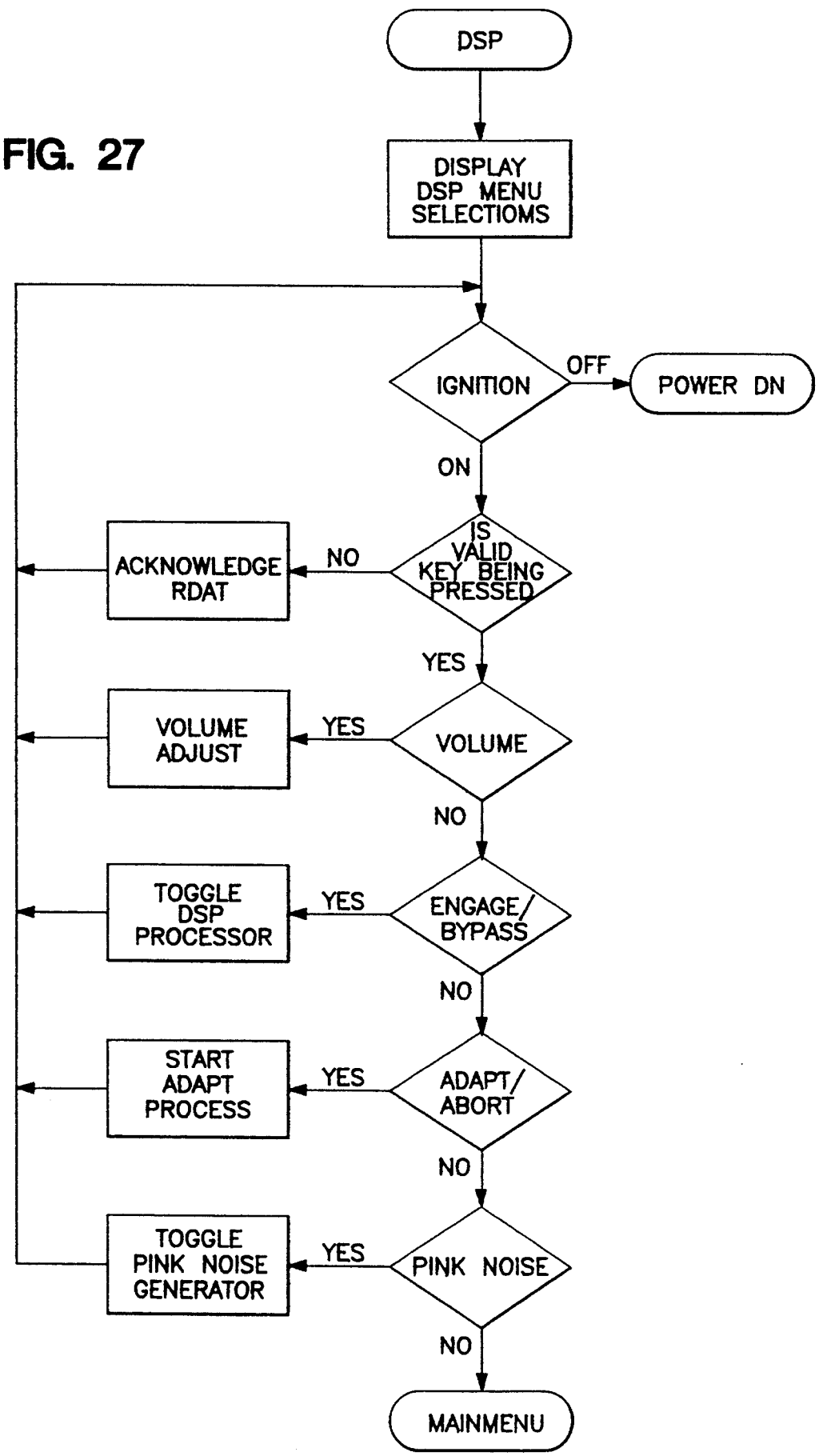
Figure 28:
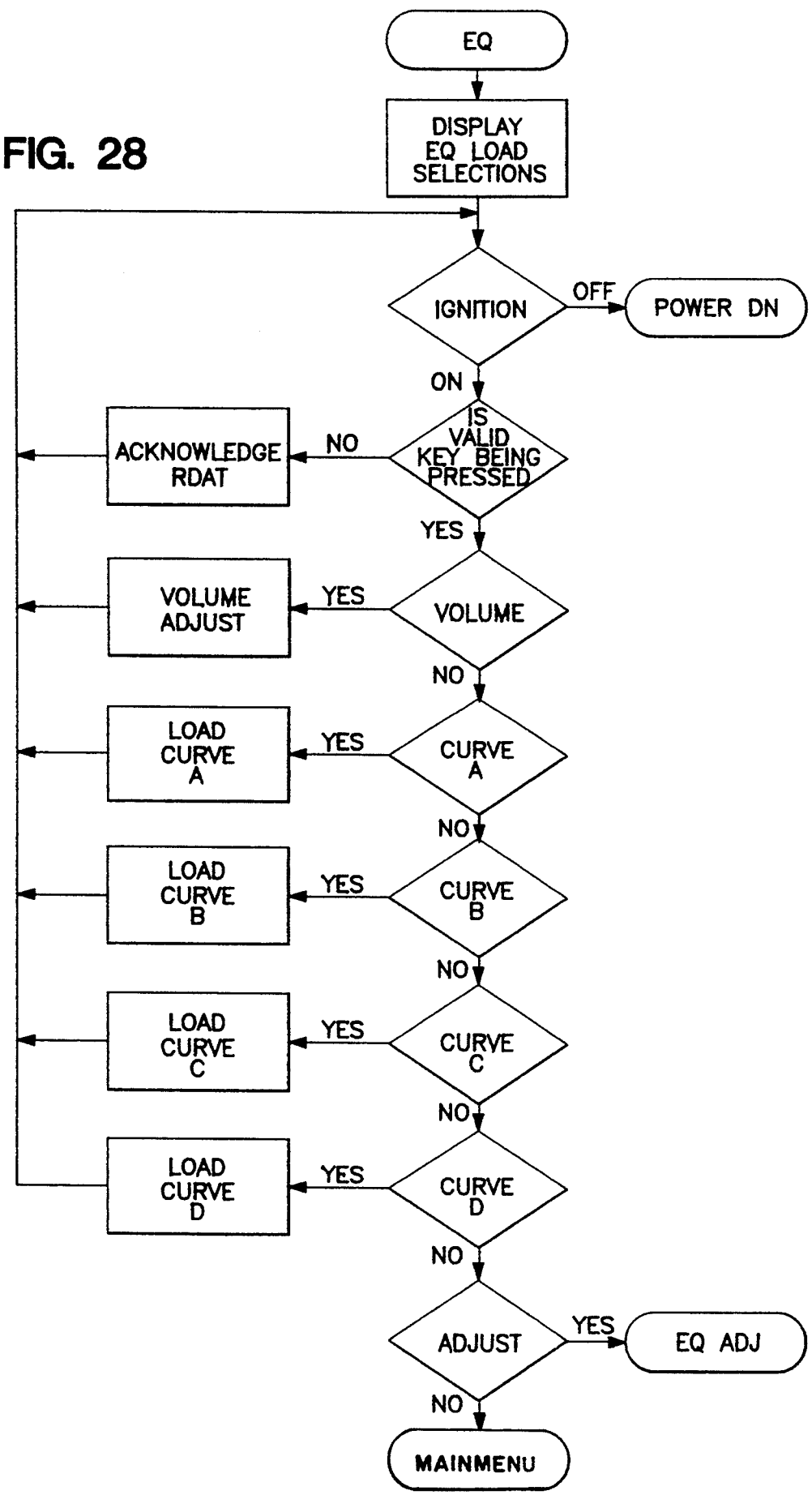
Figure 29:
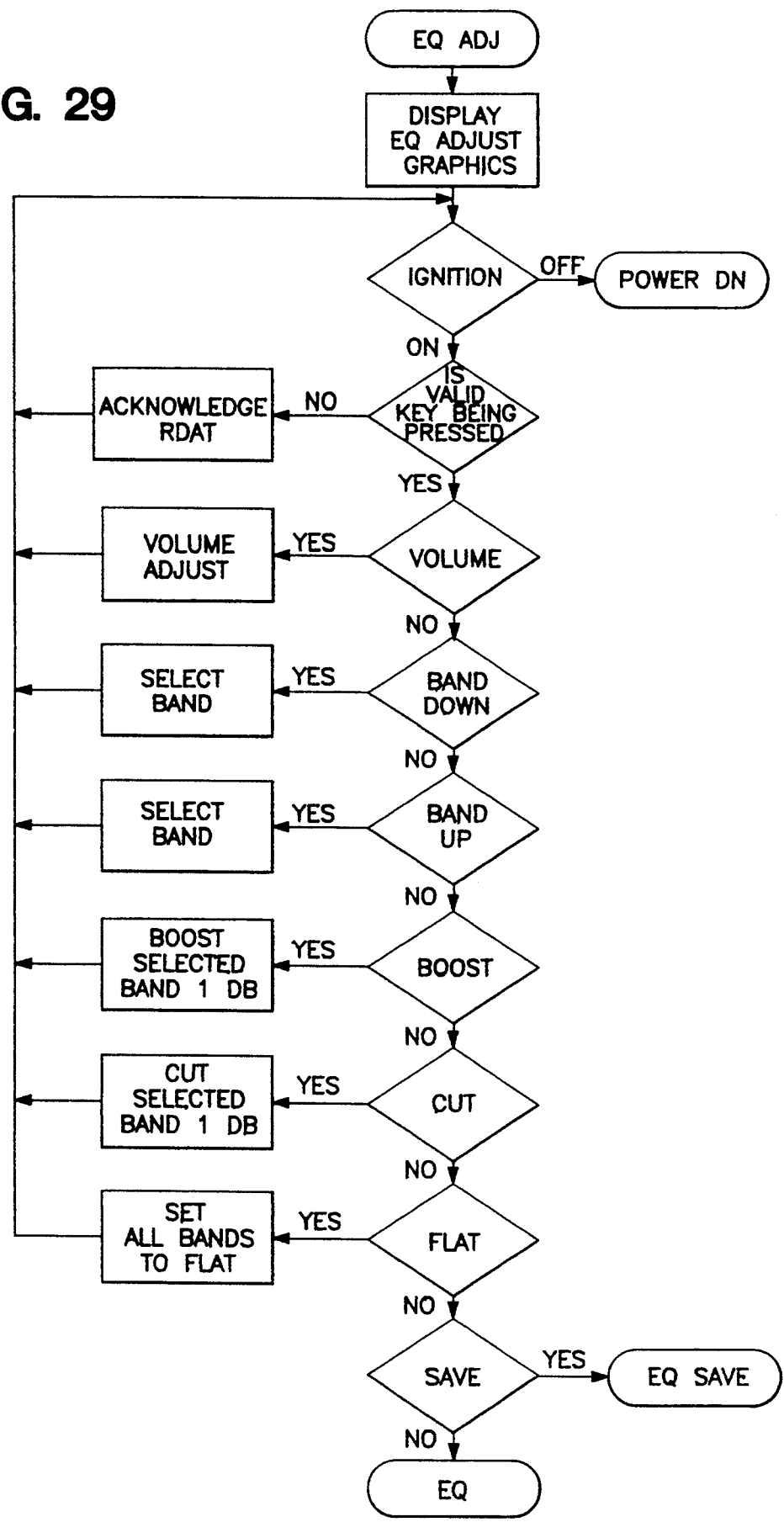
Figure 30:
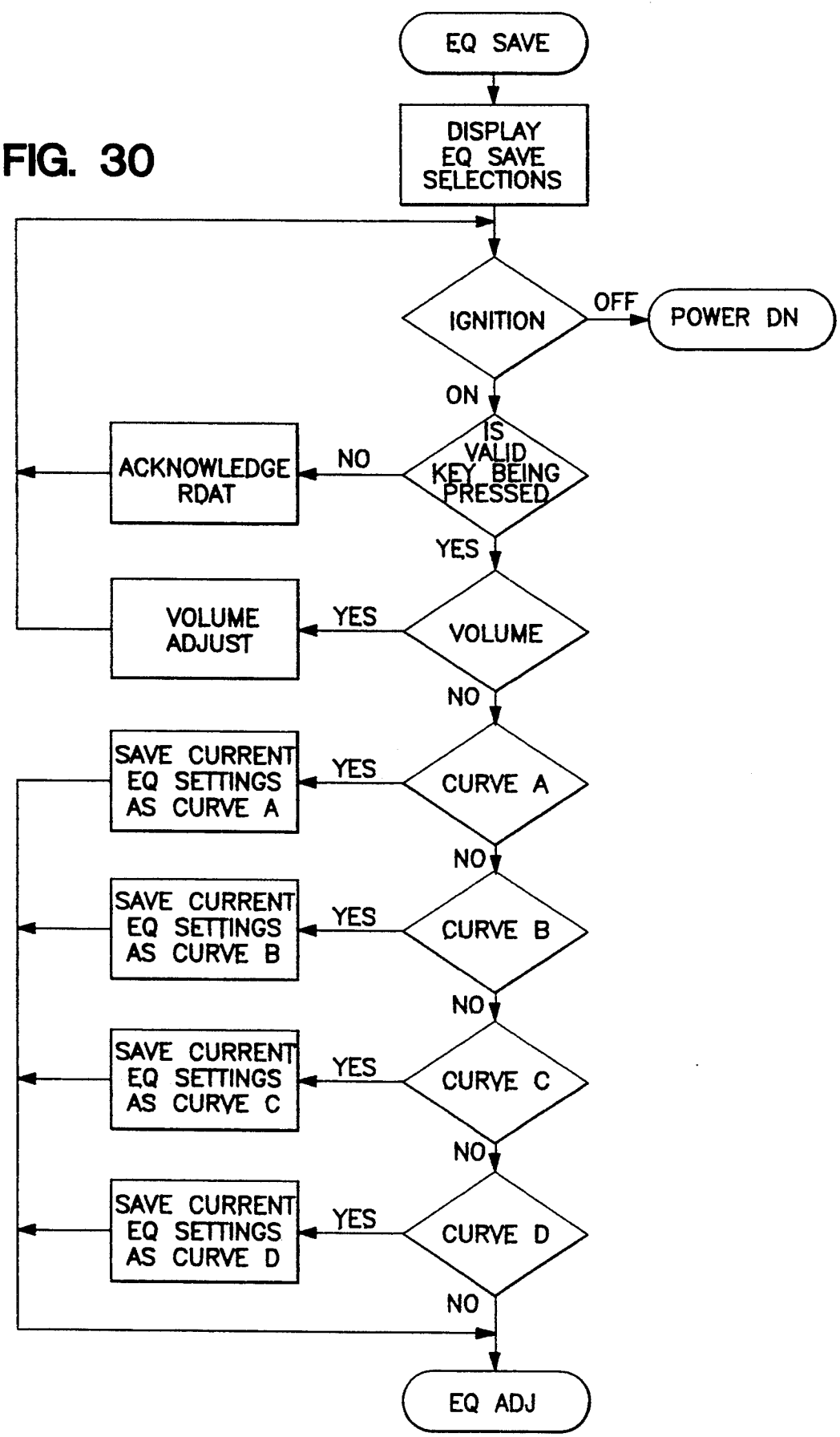
Figure 31:
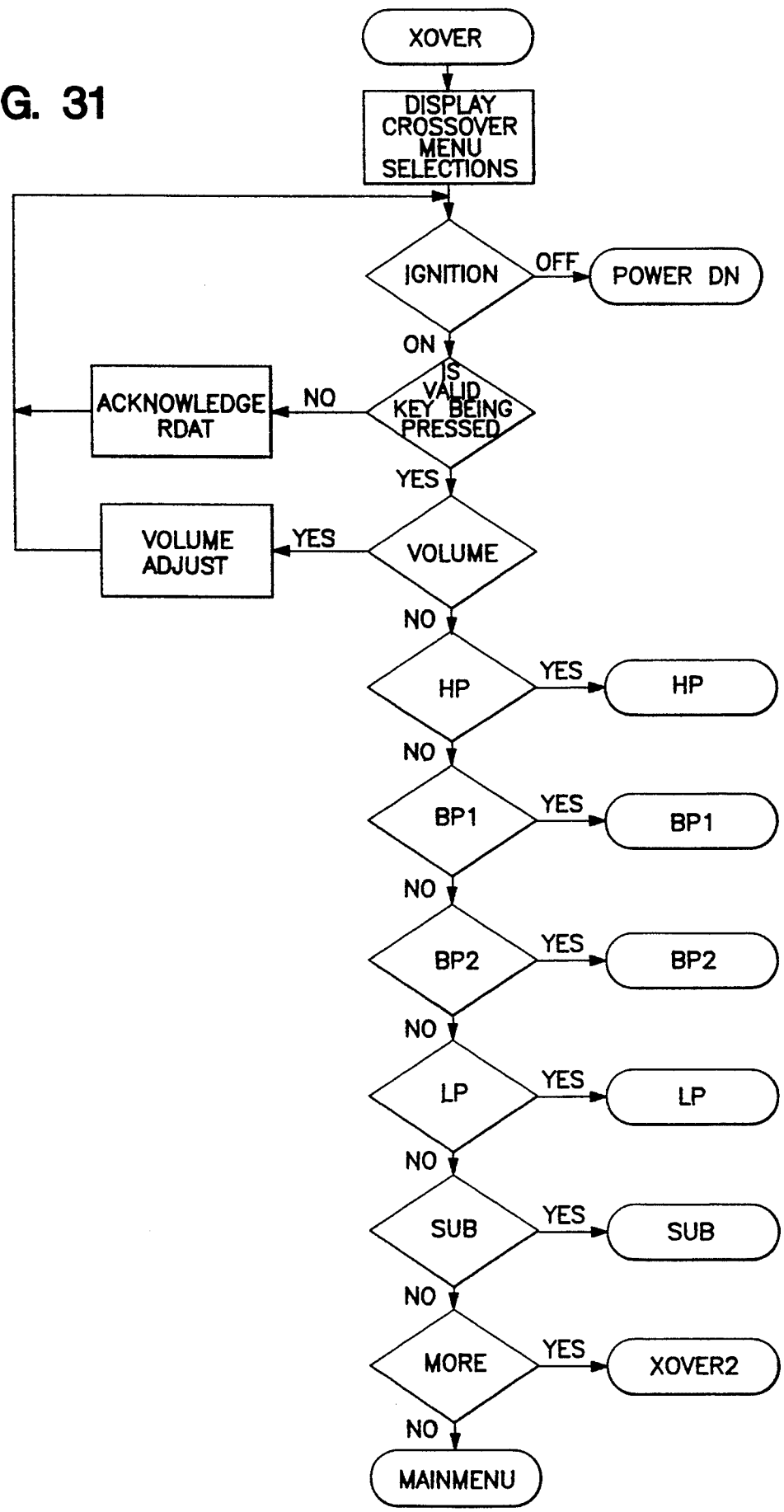
Figure 32:
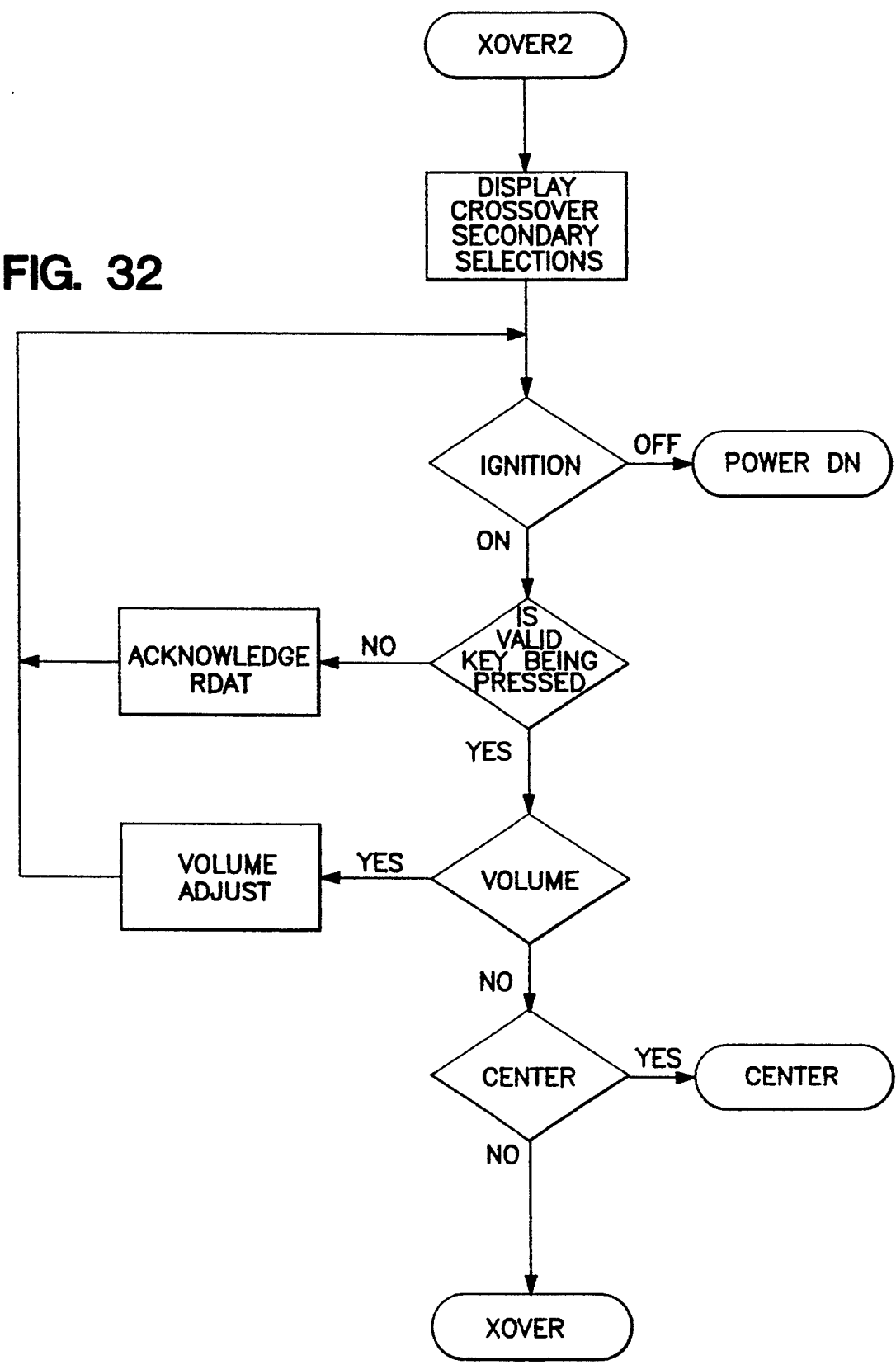
Figure 33:
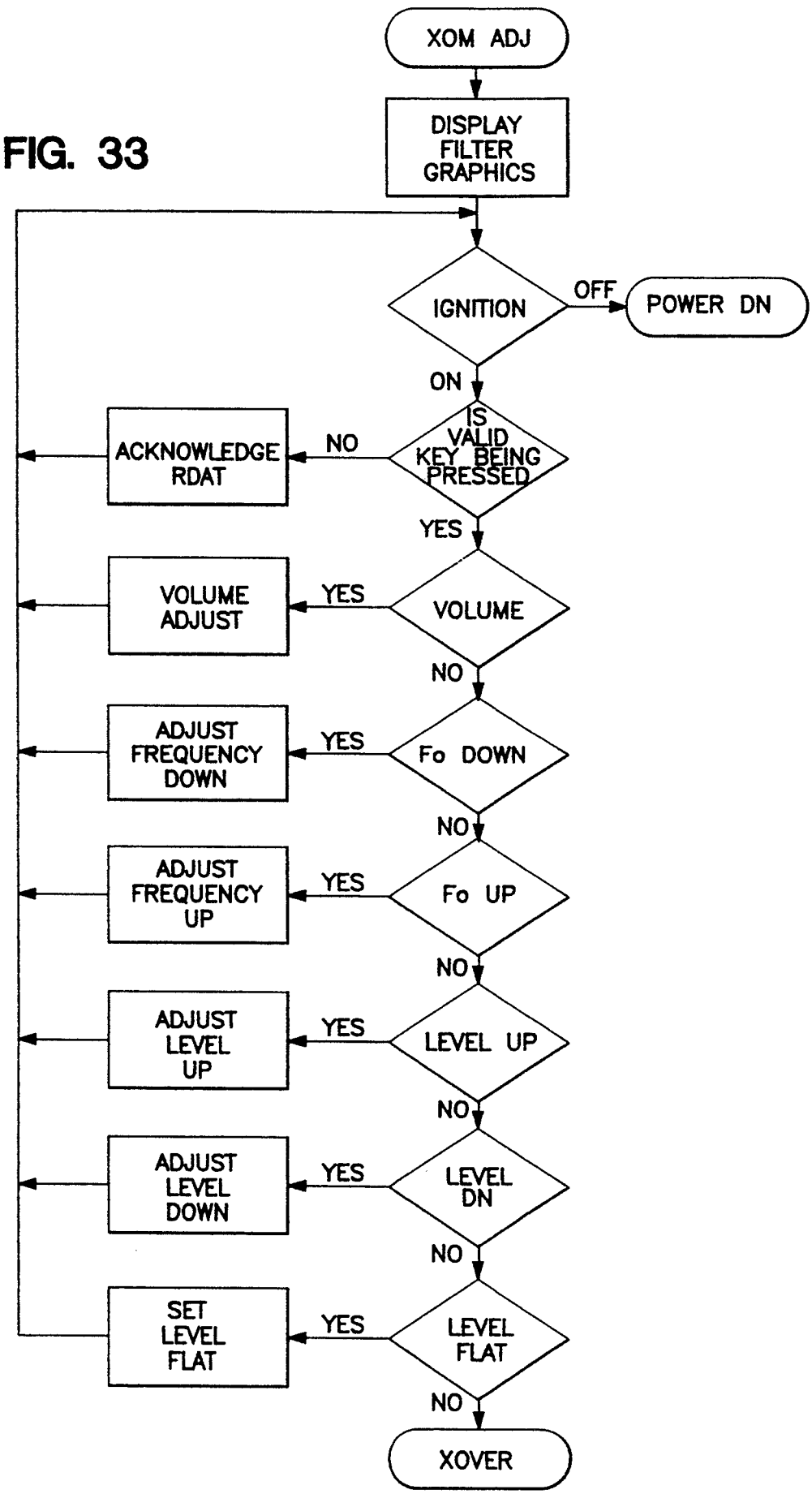
Figure 34A:
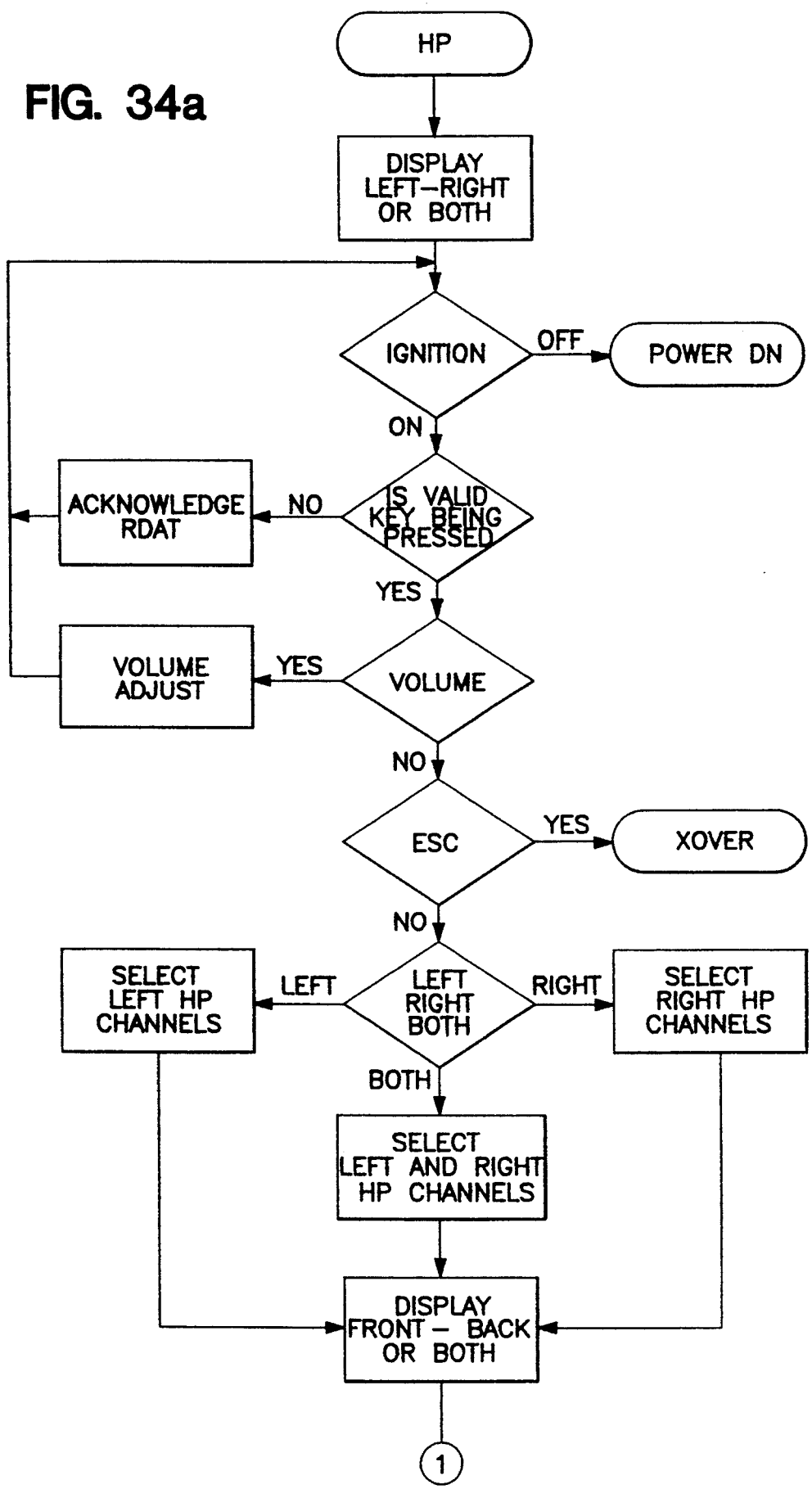
Figure 34B:
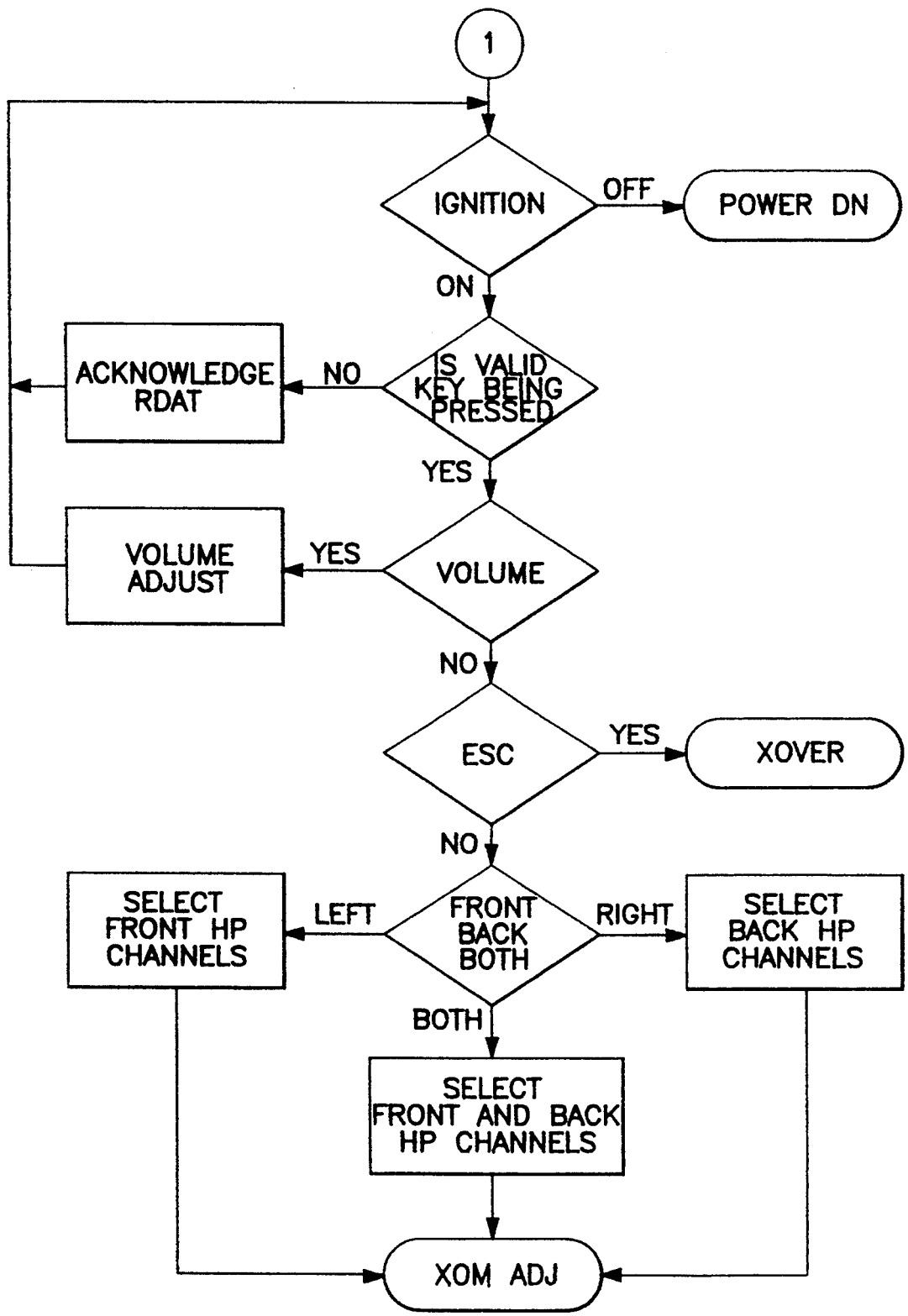
Figure 35A:
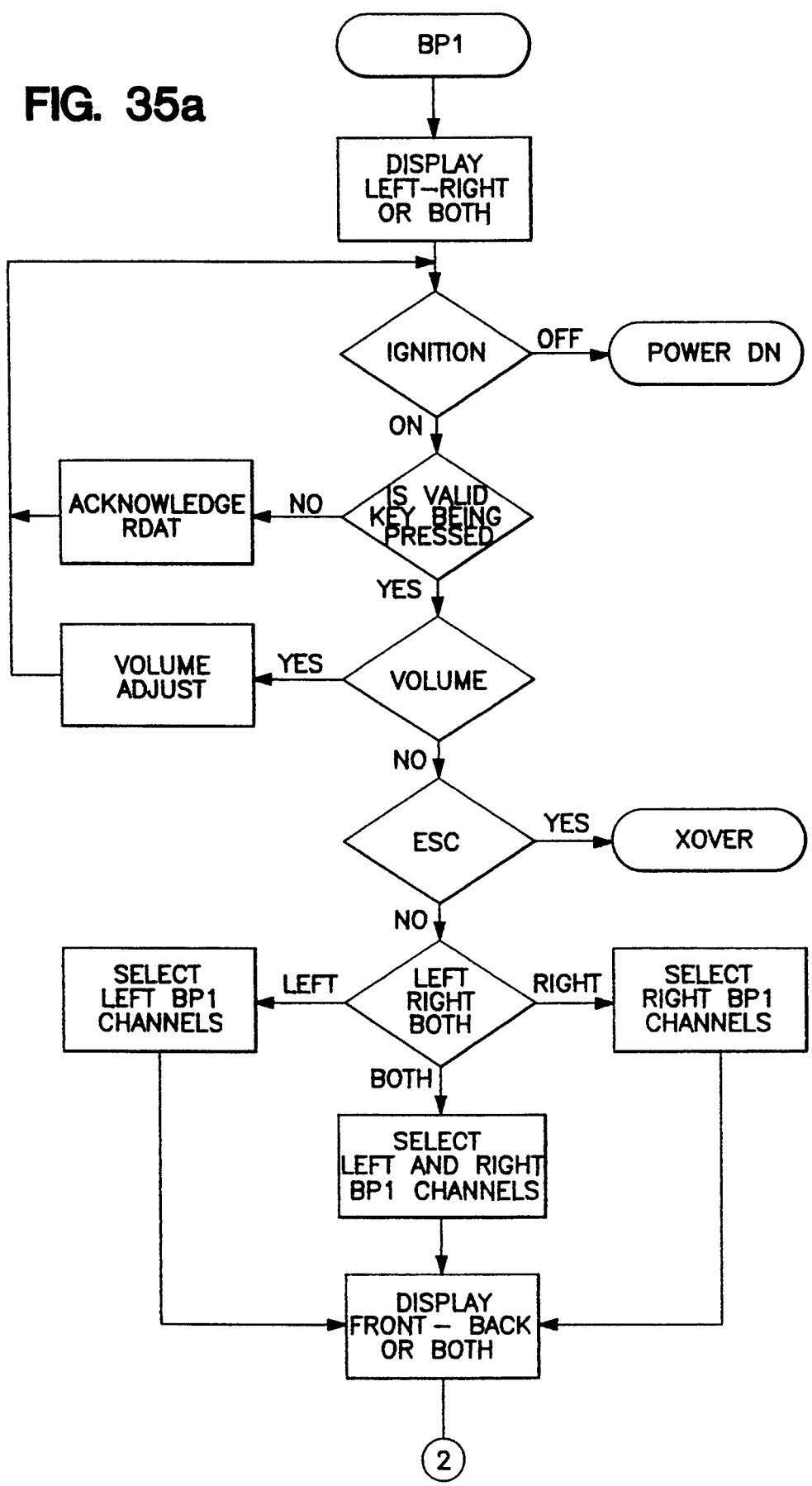
Figure 35B:
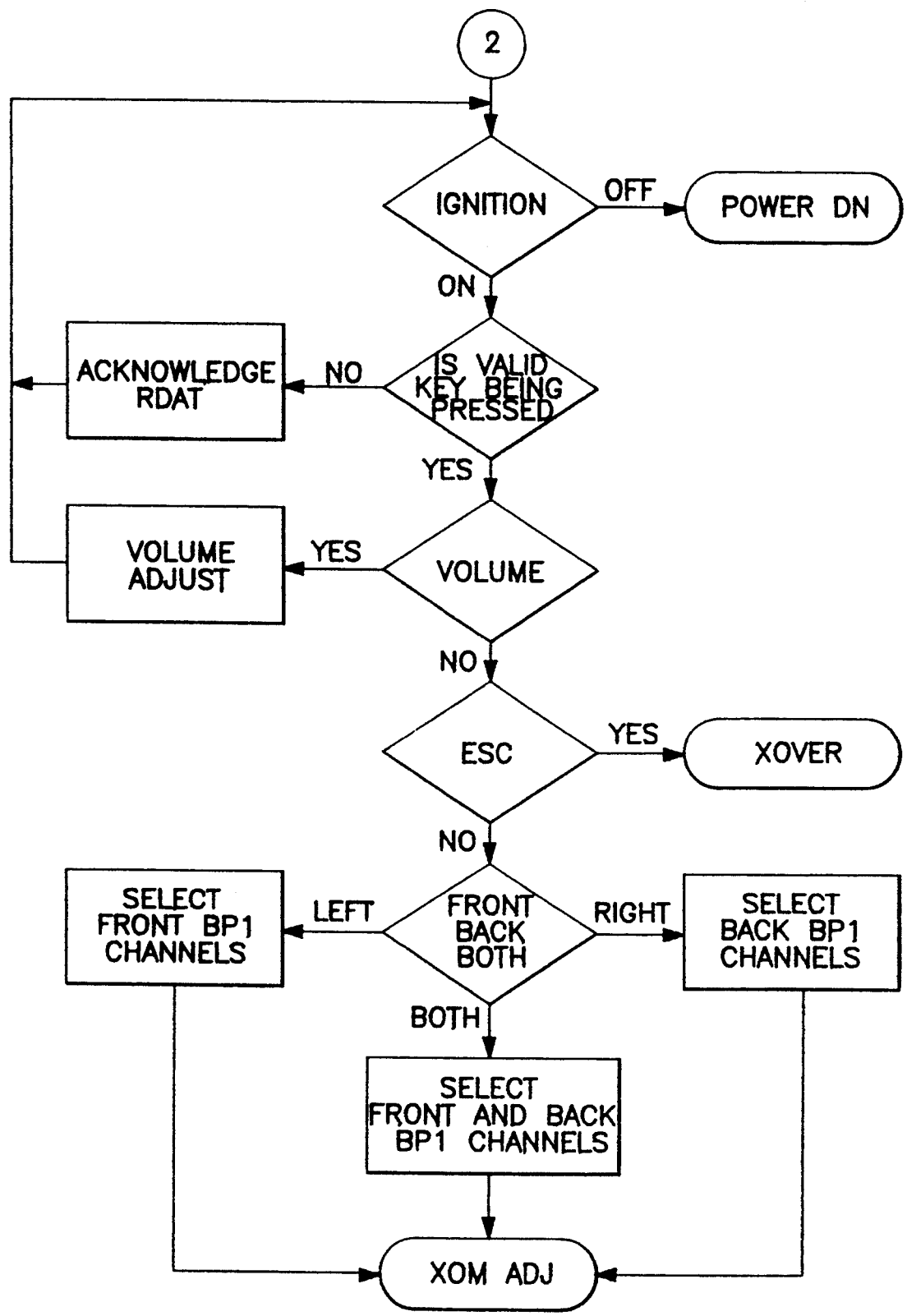
Figure 36A:
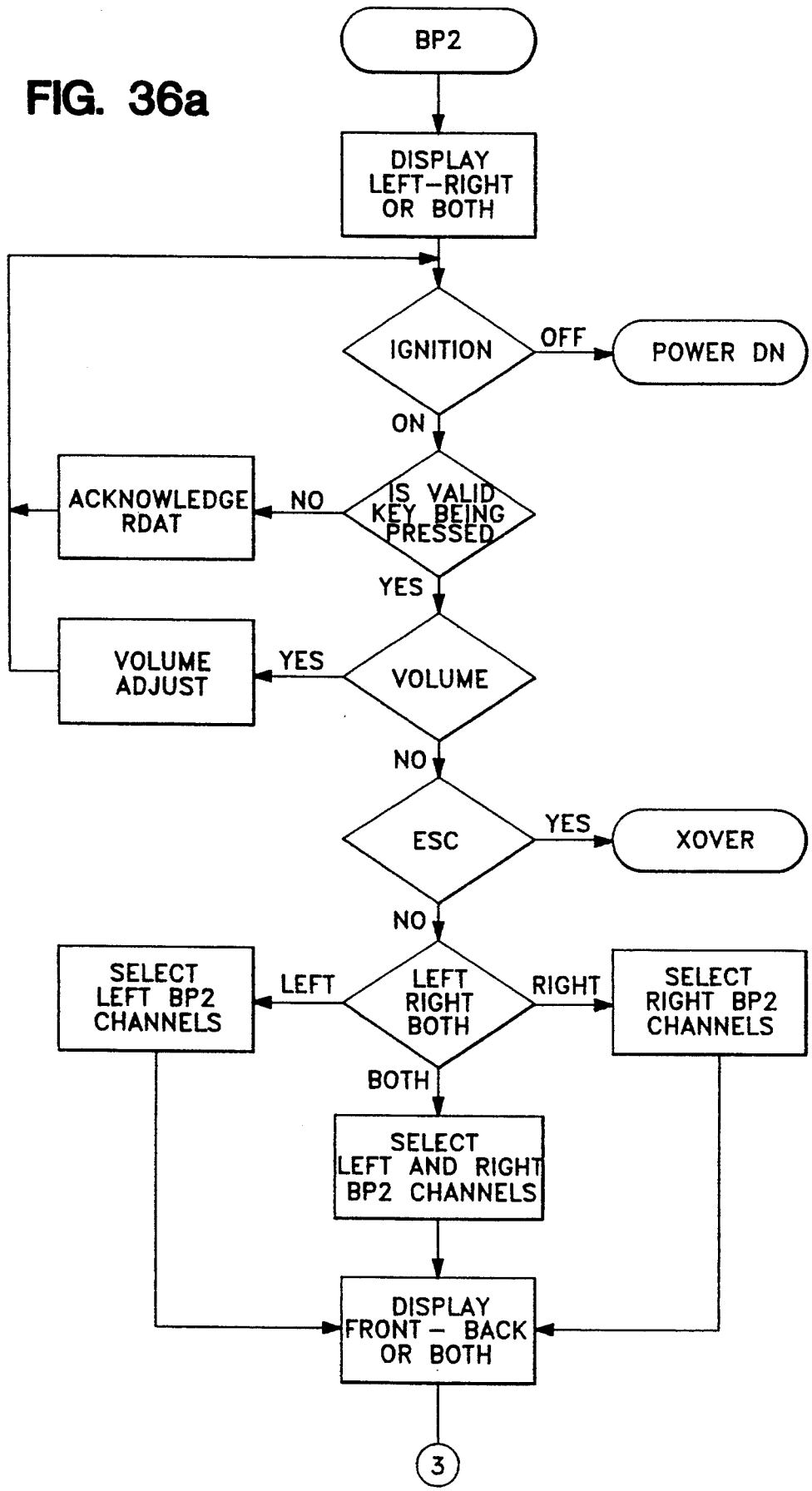
Figure 36B:
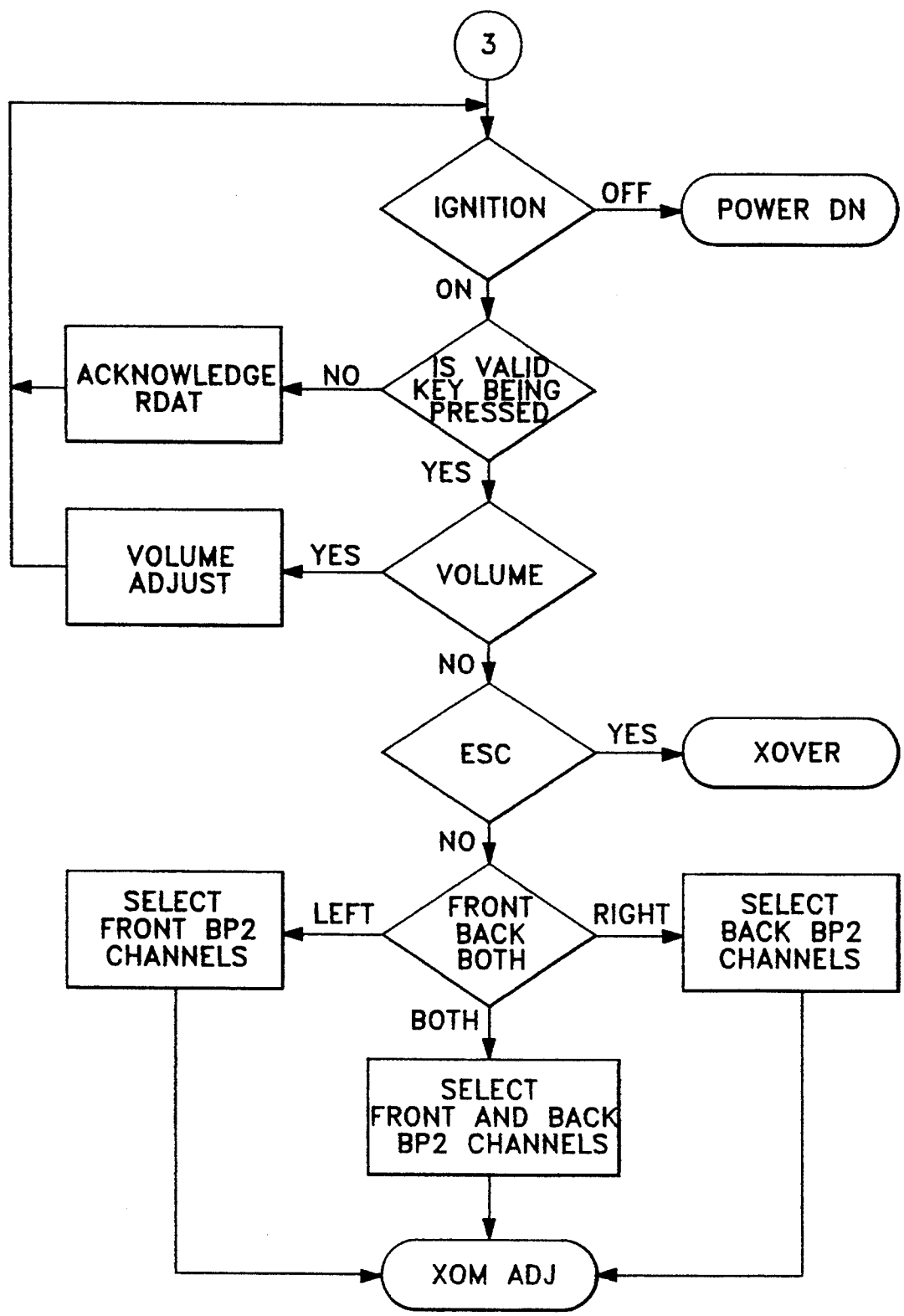
Figure 37:
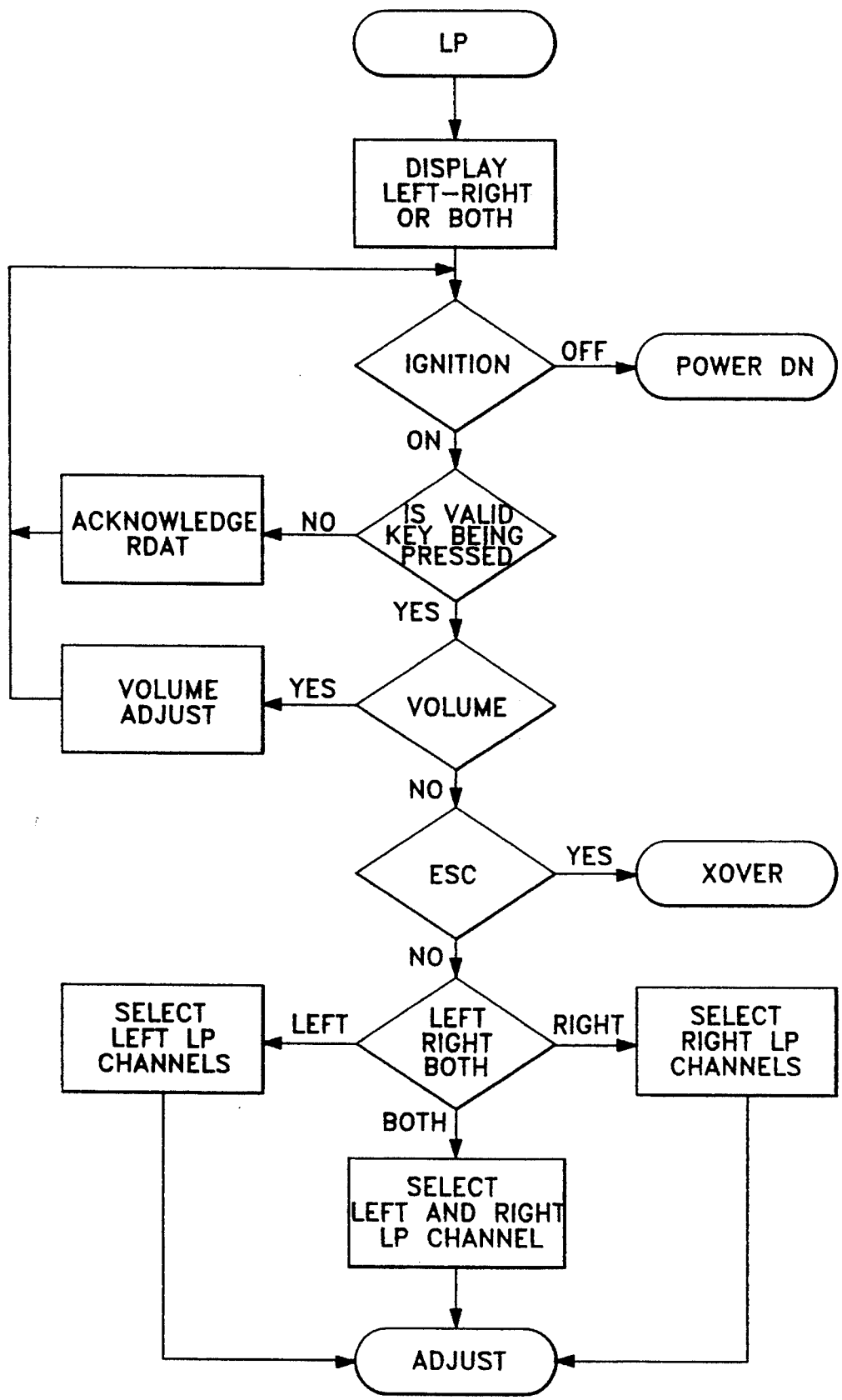
Figure 38:
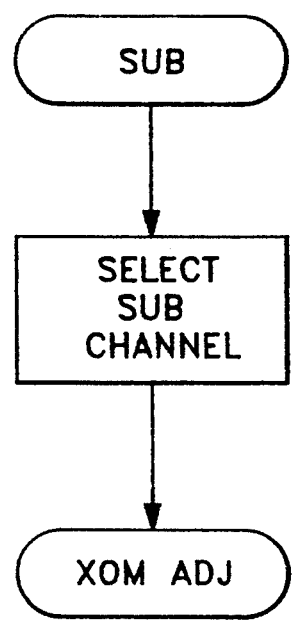
Figure 39:
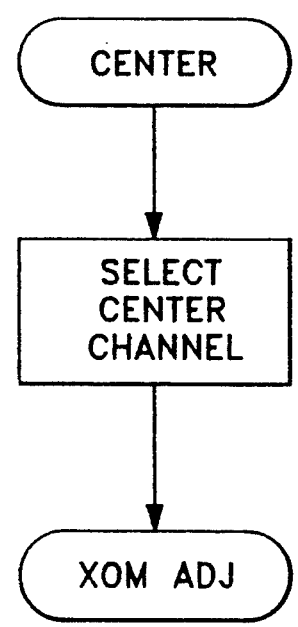

The cross-bar configuration matrix 151 is illustrated in greater detail in FIG. 13. This twenty-by-sixteen matrix allows the user to route any of the twenty (sixteen crossover and four preamplifier) potential signal outputs to any of the sixteen (four channels times four amplifiers) amplifier inputs.

Each of the amplifier channels can be configured to be either low pass, band pass, high pass, or full range. This is accomplished by placing pin connectors 153 on the cross bar configuration matrix 151 which is located on the inside of the mother board. The cross bar configuration matrix 151 is marked down the side to indicate the configuration of each amplifier channel. Each amplifier module has eight pin connectors—two per channel. Each pin connector covers one pin designated the input signal and another pin designated the output signal to that amplifier channel. The pin connectors are positioned over the desired configuration pins for each amplifier channel. The amplifiers will then receive input signals according to each channel's pin placement on the matrix. Designations for the channels are as follows:

| | |
|---|---|
| FL | = Front Left (full range) |
| FR | = Front Right (full range) |
| BL | = Back Left (full range) |
| BR | = Back Right (full range) |
| FLHP | = Front Left High Pass |
| FRHP | = Front Right High Pass |
| BLHP | = Back Left High Pass |
| BRHP | = Back Right High Pass |
| FLBP1 | = Front Left Band Pass 1 |
| FRBP1 | = Front Right Band Pass 1 |
| BLBP1 | = Back Left Band Pass 1 |
| BRBP1 | = Back Right Band Pass 1 |
| FLBP2 | = Front Left Band Pass 2 |
| FRBP2 | = Front Right Band Pass 2 |
| BLBP2 | = Back Left Band Pass 2 |
| BRBP2 | = Back Right Band Pass 2 |
| Sub L | = Left Subwoofer Low Pass |
| Sub R | = Right Subwoofer Low Pass |
| Sub M | = 24 dB/Octave Mono Low Pass |
| Center | = Front Center Channel Band Pass |

FIG. 13 shows the matrix as configured during manufacturing assembly. In this standard configuration, all four amplifiers accept full range inputs, thereby running as a standard four channel unit. The pin connectors may be moved as desired to route a selected audio input to selected amplifier channel.

B. Amplifier Modules

The amplifier module is illustrated in FIGS. 8-9 and 14-16 and is generally designated 160. The amplifier module includes a heat sink 162, a circuit card 164, and a face plate 166. The heat sink 162 is extruded of aluminum and the profile is illustrated in the end view of FIG. 16. The heat sink includes upper and lower flanges 168 and 170 which slidably interfit with the tracks 126 in a manner to be described. The heat sink also defines upper and lower grooves or tracks 172 and 174 which entrap the upper and lower edges of the circuit board or card 164 to support the card within the heat sink.

The circuit card or board 164 (see in particular FIGS. 8-9 and 16) supports the circuitry components 176 required to provide the desired amplification. The particular components and arrangement of the components on the circuit card does not comprise a portion of the present invention. Suffice it to say that the card provides 100 watts of power. The circuit card 164 includes a forward edge 178 meeting the face plate 166 and a rear edge 180 defining a plug portion 182. The plug portion supports a plurality of electrical leads 184 as necessary for connection with the other electrical components of the system. The thermal connection between the amplifier components and the heat sink is schematically illustrated at 190 in FIGS. 15-16 and is accomplished using techniques generally well known to those having ordinary skill in the art.

The face plate 166 is secured to the heat sink 162 using hex-head screws 192. A finger grip 194 is also mounted on the face plate 166 to provide a means of grasping the amplifier module. One or more LED's or other visible illuminators 196 are visible through the face plate 166 to indicate performance parameters of the system. Those presently included indicate that the unit is powered and that the signal level has been clipped.

The individual amplifier modules are slidably received within the amplifier housing 14. Specifically, the upper and lower flanges 168 and 170 (see FIG. 9) of the heat sink are slidably received within a pair of vertically aligned tracks 126 in the upper and lower chassis plates 122 and 124. When so positioned, the amplifier module 160 may be slid into or out of the housing 14 in a horizontal direction. When the module 160 is fully inserted within the housing 14, the plug portion 182 of the card 164 is inserted into the socket 150. Also when fully inserted, the face plate 166 abuts the forward edge of the chassis plates 122 and 124. To retain the module within the housing 14, the thumb screws 184 are tightened within the holes 186.

As described, the amplifier modules may be easily inserted into or withdrawn from the amplifier housing 14. Therefore, the system may be initially configured and subsequently modified simply by installing and removing amplifier modules as desired.

III. REMOTE DATA ACCESS TERMINAL

Figure 7:
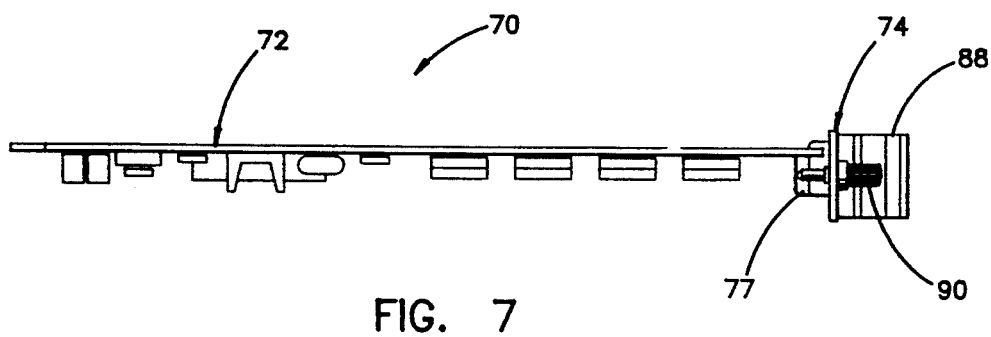
FIG. 7 is a top plan view of the component card.

The remote data access terminal (RDAT) 16 is illustrated in FIG. 7. The RDAT 16 is available in two configurations-hard-wired and RF. The standard wired version communicates with the control module within the controller housing 12 via a standard phone cable (RJ-11). The RF version communicates via radio frequency (FSK) operation. The RDAT receives data from, as well as transmits data to, the controller module. The RDAT may be mounted permanently within the vehicle, for example in the dashboard 24 (see FIG. 1), or simply held within the operator's hand.

The RDAT includes a 2-by-40 character display 200, five function keys 202, volume up/down keys 204, a mute key 206, a ten-key pad 208, an enter key 210, an escape key 212, a zero set key 214, and surrounding arrow keys 216. The function and capabilities of the RDAT are provided by the controller module within the controller housing 12 and by the software within the RDAT itself. Accordingly, the RDAT displays and allows entry of information pertinent only to the modules installed within the controller housing 12. As described above, the control module polls the slots within the controller housing upon initialization to configure the system and determine its capabilities.

The size of the RDAT lends itself to easy installation. It is din and a half in size and only one inch deep. Transmission range for the RF version varies, but is typically on the order of 100 feet.

IV. SYSTEM OPERATION

The function of the system is controlled by the controller module within the controller housing 12. The input/output device for the controller module is the RDAT 16. Flow charts setting forth the operation of the controller module are set forth in FIGS. 18-39. These flow charts in conjunction with the following description provide a disclosure from which one having ordinary skill in the programming art could produce the requisite software.

When the system is powered, the controller module first turns on all signal processing modules. After those components have stabilized, the controller module turns on the system amplifiers. Powering the system down occurs in the opposite sequence to eliminate any turn-on or turn-off pop that otherwise might be heard over the speakers.

After the system is powered on, the display will appear as follows:

```
      Volume | | | | | | | | | | |::::::::::        >
POWER     PREAMP    DSP      EQ    XOVER
```

Volume will slowly rise to the last used setting. Pressing any key during this function will stop the volume at that point. Any of the indicated units (power on/off, preamplifier, digital signal processor, equalizer, or crossover as shown above) may be accessed simply by pressing the corresponding function key. For example, pressing the preamp function key will result in the following display:

```
             * PREAMP MENU *
       SOURCE    FADER    TONE
```

To change the source, the user would press the function key associated with the "source" enunciator and the display would appear as follows:

```
         PREAMP/SOURCE
         <A>    B    C    D
```

At this point, the user can select any one of the four sources simply by pressing the associated function key 202. For example, pressing the function key associated with source B would produce the following display:

```
        PREAMP/SOURCE
    A      <B>      C      D
```

The volume keys 204 will adjust the system volume at any time. Additionally, pressing the mute key 206 will decrease the volume by 20 decibels (dB). Pressing the mute button 206 again will return the volume to normal.

Selecting the fader from the main menu will present the following display:

```
    L ::::::: | ::::::: R        F ::::::: | ::::::: B
        Balance                      Fader
```

By pressing the right arrow key 216, balance is adjusted to the right. Pressing the left arrow key 216 will adjust balance to the left. Pressing the top arrow key 216 will fade toward the front of the vehicle, and pressing the bottom arrow key 216 will fade toward the rear. By pressing the zero set key 214, the balance and fader will return to the "flat" position with the display indicated above. To return to the main menu, press the escape key 212.

Pressing the function key under tone will present the following display:

```
    — ::::::: | ::::::: +        — ::::::: | ::::::: +
        < 45 HZ >                    15 KHZ
```

When in this mode, the left arrow key 216 selects bass, and the right arrow key selects treble. The top and bottom arrow keys 216 can boost or cut bass or treble by up to 12 dB.

The descriptive function of the RDAT 16 and control module in controlling the other system components can be readily discerned from the flow charts in the drawings. It is thus seen that the entire system is controlled and adjusted using only the RDAT 16, which interacts with the control module. The system therefore is extremely easy to operate or "user friendly."

It will also be appreciated that the modular construction of the controller housing 12 and the amplifier housing 14 facilitate the configuration and installation of the system 10. With the minimal constraints discussed above, the modular audio component cards can be installed in virtually any slot within the controller housing 12; and the modular amplifier components can be installed in any slot within the amplifier housing 14. Because the controller module polls all of the controller housing slots upon initialization and configures itself in response to the cards present, the system is readily and easily adaptable. Components may be easily updated by removing the "old" card and installing the "new" replacement card. Components may be easily added by simply installing the "new" card.

The above description is that of a preferred embodiment of the invention. Various alterations and changes can be made without departing from the spirit and broader aspects of the invention that are defined in the appended claims, which are to be interpreted in accordance with the principles of patent law including the doctrine of equivalents.

The embodiments of the invention is which an exclusive property or privilege is claimed are defined as follows:

1. An automotive audio system comprising:
   an amplifier housing including a plurality of amplifier slots and a plurality of amplifier sockets each associated with one of said amplifier slots;
   a plurality of amplifier components inserted within said amplifier slots, each component including a plug end fitting within one of said amplifier sockets when said component is installed within the associated amplifier slot;
   an amplifier output circuit including speaker output terminals electrically connected to said amplifier sockets;
   a controller housing including a plurality of controller slots and a plurality of controller sockets each associated with one of said controller slots, said controller housing further including audio signal bus means for delay-chaining said controller sockets together enabling an audio signal to be serially routed to said sockets;
   a plurality of signal processing components insertable within said controller slots, each component including a plug end fitting within one of said controller slots when said component is installed within the associated controller slot, said signal processing components being physically interchangeable within said controller slots;
   a communications bus within said controller housing and connected to said controller sockets enabling communication with components plugged into said controller sockets; and
   a controller component within said housing and connected to said communications bus, said controller component including means for determining the location and type of signal processing components installed within said controller slots, said controller component including means for configuring said system in response to said determined signal processing components, said controller component further including means for issuing control signals to said determined signal processing components.

2. An audio system as defined in claim 1 wherein said signal processing components include a power supply and a preamplifier.

3. An audio system as defined in claim 1 further comprising a radio-frequency (RF) remote data access terminal operable via radio frequency from a location remote from the remainder of said system, said terminal including an alphanumeric display.

4. An audio system as defined in claim 1 wherein:
   each of said amplifier housing slots includes a pair of opposed channels opening toward one another; and
   each of said amplifier components includes an extruded heat sink having opposed flanges slidably interfitting with said slots and a circuit board supported by said heat ink, whereby each amplifier component can be slid into and out of said amplifier housing.

5. An audio system comprising:
   a controller housing including a controller computer means for controlling the operation of the audio system, said controller housing further including a plurality of slot means each for receiving an audio component, each of said slot means including an electrical socket associated therewith;
   a plurality of audio components each providing a distinct audio signal processing function, each audio component being received within one of said slot means in said controller housing, each of said audio components having a plug portion interfitting with one of said socket means as said component is installed within the associated slot means, said audio components being physically interchangeable within said slot means, whereby each of said audio components can be received within any one of a plurality of the socket means, each of said audio components including computer means for controlling the function performed by said component;

data bus means for interconnecting said controller computer means and said controller housing sockets via said data bus means enabling said controller computer means to communicate with each of said component computer means; and audio bus means for daisy-chaining said controller housing sockets together to provide a serial non-mixing audio signal path through said audio components;

said controller computer means including means for polling said controller housing sockets via said data bus means to determine which sockets have components connected thereto, for determining the type of component by interrogating said component, and for configuring said system in response to the presence and types of audio components connected to said controller housing sockets.

6. An audio system as defined in claim 5 wherein said audio components include a power supply component and a preamplifier component.

7. An audio system as defined in claim 5 further comprising a radio-frequency (RF) remote data access terminal means for providing input and output user interface via radio frequency with said controller computer means, said access terminal being capable of remote location from the remainder of said audio system.

8. An audio system comprising:
a controller housing including a control computer means for controlling the operation of the audio system, said controller housing further including a plurality of slot means each for receiving an audio component, each of said slot means including an electrical socket associated therewith;
a plurality of audio components each providing a distinct audio signal processing function, each audio component being received within one of said slot means in said controller housing, each of said audio components having a plug portion interfitting with one of said socket means as said component is installed within the associated slot means, said audio components being physically interchangeable within said slot means, whereby each of said audio components can be received within any one of a plurality of the socket means, each of said audio components including computer means for controlling the function performed by said component;
data bus means for interconnecting said controller computer means and said controller housing sockets via said data bus means enabling said controller computer means to communicate with each of said component computer means; and
audio bus means for daisy-chaining said controller housing sockets together to provide an audio signal path through said audio components;
said controller computer means including means for polling said controller housing sockets via said data bus means to determine which sockets have components connected thereto, for determining the type of component by interrogating said component, and for configuring said system in response to the presence and types of audio components connected to said controller housing sockets, said controller computer means being physically interchangeable with said audio components.

9. An audio system comprising:
a controller housing for receiving and supporting audio component modules, said housing including a plurality of slot means each for receiving one of said modules and each including an electrical socket associated therewith;
an audio bus serially interconnecting said sockets;
a communications bus interconnecting said sockets on said controller housing;
a plurality of audio component modules each removably insertable within one of said controller housing slots means, each said module including a plug interfitting with the associated socket when said component is installed within said housing; and
a control means for communicating with each of said audio components installed within said controller housing via said communications bus, said control means including means for determining the location and type of all component modules installed within said housing, for configuring said audio system in response to the detected modules, and for sending control signals as necessary to the detected modules.

10. An audio system as defined in claim 9 wherein said modules include a power supply and a preamplifier.

* * * * *

UNITED STATES PATENT AND TRADEMARK OFFICE
CERTIFICATE OF CORRECTION

PATENT NO. :   5,339,362
DATED      :   August 16, 1994
INVENTOR(S):   Wayne Harris It is certified that error appears in the above-indentified patent and that said Letters Patent is hereby corrected as shown below:

Column 20, Claim 1, Line 16:
    "delay-chaining" should be --daisy-chaining--

Column 20, Claim 4, Line 54:
    "ink," should be --sink,--

Signed and Sealed this

Eighth Day of November, 1994

Attest:

BRUCE LEHMAN

*Attesting Officer*              *Commissioner of Patents and Trademarks*